(12) United States Patent
Gutman et al.

(10) Patent No.: US 12,284,063 B2
(45) Date of Patent: Apr. 22, 2025

(54) DIGITAL PRE-DISTORTION SIGNALING

(71) Applicant: QUALCOMM Incorporated, San Diego, CA (US)

(72) Inventors: Igor Gutman, Hod HaSharon (IL); Shubham Ahuja, San Diego, CA (US); Alexander Dorosenco, El Cajon, CA (US); Tao Luo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 14 days.

(21) Appl. No.: 18/448,108

(22) Filed: Aug. 10, 2023

(65) Prior Publication Data

US 2025/0055734 A1    Feb. 13, 2025

(51) Int. Cl.
*H04L 25/49*    (2006.01)
*H03F 1/32*    (2006.01)
*H04B 1/62*    (2006.01)

(52) U.S. Cl.
CPC .......... *H04L 25/49* (2013.01); *H03F 1/3241* (2013.01); *H04B 1/62* (2013.01)

(58) Field of Classification Search
CPC .......... H04L 25/49; H03F 1/3241; H04B 1/62
See application file for complete search history.

(56) References Cited

U.S. PATENT DOCUMENTS

| 9,960,794 B2 | 5/2018 | Weissman et al. |
| 11,245,428 B2 | 2/2022 | Gutman |
| 11,296,735 B1 | 4/2022 | Kutz et al. |
| 11,658,692 B2* | 5/2023 | Gutman ............... H04B 7/0639 455/114.3 |
| 2012/0154036 A1* | 6/2012 | Oh ........................ H03F 1/0266 330/127 |

(Continued)

FOREIGN PATENT DOCUMENTS

WO    2021148061 A2    7/2021

OTHER PUBLICATIONS

International Search Report and Written Opinion—PCT/US2024/040959 - ISA/EPO—Dec. 23, 2024 (2304327WO).

(Continued)

*Primary Examiner* — Sung S Ahn
(74) *Attorney, Agent, or Firm* — QUALCOMM Incorporated

(57) ABSTRACT

Various aspects of the present disclosure generally relate to wireless communication. In some aspects, a transmitter device may transmit, to each receiver device of a plurality of receiver devices communicating with the transmitter device over a wideband channel using frequency division multiplexing, an indication of a bandwidth portion of the wideband channel to be used by the receiver device for performing measurements associated with a non-linear model of the transmitter device. The transmitter device may transmit, to each receiver device of the plurality of receiver devices, one or more wideband reference signals associated with training the non-linear model. The transmitter device may receive a plurality of digital pre-distortion (DPD) coefficients, obtain a set of DPD coefficients based at least in part on combining the plurality of DPD coefficients, and perform DPD processing in accordance with the set of DPD coefficients. Numerous other aspects are described.

30 Claims, 11 Drawing Sheets

(56) References Cited

U.S. PATENT DOCUMENTS

2022/0376713 A1* 11/2022 Carbone .............. H04B 1/0082
2023/0014042 A1    1/2023 Barak et al.

OTHER PUBLICATIONS

Qualcomm Incorporated: "Network Energy Saving Techniques", 3GPP TSG RAN WG1 #109-e, 3rd Generation Partnership Project, Mobile Competence Centre, 650, Route Des Lucioles, F-06921 Sophia-Antipolis Cedex, France, vol. RAN WG1, No. e-Meeting, Mar. 9, 2022-Mar. 20, 2022, Apr. 29, 2022, 19 Pages, XP052191708, Section 5.1.

* cited by examiner

DIGITAL PRE-DISTORTION SIGNALING

FIELD OF THE DISCLOSURE

Aspects of the present disclosure generally relate to wireless communication and to techniques and apparatuses for digital pre-distortion signaling.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include one or more network nodes that support communication for wireless communication devices, such as a user equipment (UE) or multiple UEs. A UE may communicate with a network node via downlink communications and uplink communications. "Downlink" (or "DL") refers to a communication link from the network node to the UE, and "uplink" (or "UL") refers to a communication link from the UE to the network node. Some wireless networks may support device-to-device communication, such as via a local link (e.g., a sidelink (SL), a wireless local area network (WLAN) link, and/or a wireless personal area network (WPAN) link, among other examples).

The above multiple access technologies have been adopted in various telecommunication standards to provide a common protocol that enables different UEs to communicate on a municipal, national, regional, and/or global level. New Radio (NR), which may be referred to as 5G, is a set of enhancements to the LTE mobile standard promulgated by the 3GPP. NR is designed to better support mobile broadband internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink, using CP-OFDM and/or single-carrier frequency division multiplexing (SC-FDM) (also known as discrete Fourier transform spread OFDM (DFT-s-OFDM)) on the uplink, as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

Some aspects described herein relate to a method of wireless communication performed by a transmitter device. The method may include transmitting, to each receiver device of a plurality of receiver devices communicating with the transmitter device over a wideband channel using frequency division multiplexing (FDM), an indication of a bandwidth portion of the wideband channel to be used by the receiver device for performing measurements associated with a non-linear model of the transmitter device. The method may include transmitting, to each receiver device of the plurality of receiver devices, one or more wideband reference signals associated with training the non-linear model. The method may include receiving a plurality of digital pre-distortion (DPD) coefficients, each DPD coefficient of the plurality of DPD coefficients being received from a receiver device of the plurality of receiver devices and being based at least in part on a channel estimation measurement or a channel equalization measurement associated with the one or more wideband reference signals and a respective bandwidth portion of the wideband channel. The method may include obtaining a set of DPD coefficients based at least in part on combining the plurality of DPD coefficients received from the plurality of receiver devices. The method may include performing DPD processing in accordance with the set of DPD coefficients.

Some aspects described herein relate to a method of wireless communication performed by a receiver device. The method may include receiving, from a transmitter device, an indication of a bandwidth portion of a wideband channel to be used by the receiver device for performing measurements associated with a non-linear model of the transmitter device. The method may include receiving, from the transmitter device, one or more wideband reference signals associated with training the non-linear model. The method may include obtaining a DPD coefficient based at least in part on performing a channel estimation measurement or a channel equalization measurement associated with the one or more wideband reference signals and within the bandwidth portion. The method may include transmitting, to the transmitter device, the DPD coefficient.

Some aspects described herein relate to a transmitter device for wireless communication. The transmitter device may include one or more memories and one or more processors coupled to the one or more memories. The one or more processors may be configured to transmit, to each receiver device of a plurality of receiver devices communicating with the transmitter device over a wideband channel using FDM, an indication of a bandwidth portion of the wideband channel to be used by the receiver device for performing measurements associated with a non-linear model of the transmitter device. The one or more processors may be configured to transmit, to each receiver device of the plurality of receiver devices, one or more wideband reference signals associated with training the non-linear model. The one or more processors may be configured to receive a plurality of DPD coefficients, each DPD coefficient of the plurality of DPD coefficients being received from a receiver device of the plurality of receiver devices and being based at least in part on a channel estimation measurement or a channel equalization measurement associated with the one or more wideband reference signals and a respective bandwidth portion of the wideband channel. The one or more processors may be configured to obtain a set of DPD coefficients based at least in part on combining the plurality of DPD coefficients received from the plurality of receiver devices. The one or more processors may be configured to perform DPD processing in accordance with the set of DPD coefficients.

Some aspects described herein relate to a receiver device for wireless communication. The receiver device may include one or more memories and one or more processors coupled to the one or more memories. The one or more processors may be configured to receive, from a transmitter device, an indication of a bandwidth portion of a wideband channel to be used by the receiver device for performing measurements associated with a non-linear model of the transmitter device. The one or more processors may be configured to receive, from the transmitter device, one or more wideband reference signals associated with training the non-linear model. The one or more processors may be configured to obtain a DPD coefficient based at least in part on performing a channel estimation measurement or a channel equalization measurement associated with the one or more wideband reference signals and within the bandwidth portion. The one or more processors may be configured to transmit, to the transmitter device, the DPD coefficient.

Some aspects described herein relate to a non-transitory computer-readable medium that stores a set of instructions for wireless communication by a transmitter device. The set of instructions, when executed by one or more processors of the transmitter device, may cause the transmitter device to transmit, to each receiver device of a plurality of receiver devices communicating with the transmitter device over a wideband channel using FDM, an indication of a bandwidth portion of the wideband channel to be used by the receiver device for performing measurements associated with a non-linear model of the transmitter device. The set of instructions, when executed by one or more processors of the transmitter device, may cause the transmitter device to transmit, to each receiver device of the plurality of receiver devices, one or more wideband reference signals associated with training the non-linear model. The set of instructions, when executed by one or more processors of the transmitter device, may cause the transmitter device to receive a plurality of DPD coefficients, each DPD coefficient of the plurality of DPD coefficients being received from a receiver device of the plurality of receiver devices and being based at least in part on a channel estimation measurement or a channel equalization measurement associated with the one or more wideband reference signals and a respective bandwidth portion of the wideband channel. The set of instructions, when executed by one or more processors of the transmitter device, may cause the transmitter device to obtain a set of DPD coefficients based at least in part on combining the plurality of DPD coefficients received from the plurality of receiver devices. The set of instructions, when executed by one or more processors of the transmitter device, may cause the transmitter device to perform DPD processing in accordance with the set of DPD coefficients.

Some aspects described herein relate to a non-transitory computer-readable medium that stores a set of instructions for wireless communication by a receiver device. The set of instructions, when executed by one or more processors of the receiver device, may cause the receiver device to receive, from a transmitter device, an indication of a bandwidth portion of a wideband channel to be used by the receiver device for performing measurements associated with a non-linear model of the transmitter device. The set of instructions, when executed by one or more processors of the receiver device, may cause the receiver device to receive, from the transmitter device, one or more wideband reference signals associated with training the non-linear model. The set of instructions, when executed by one or more processors of the receiver device, may cause the receiver device to obtain a DPD coefficient based at least in part on performing a channel estimation measurement or a channel equalization measurement associated with the one or more wideband reference signals and within the bandwidth portion. The set of instructions, when executed by one or more processors of the receiver device, may cause the receiver device to transmit, to the transmitter device, the DPD coefficient.

Some aspects described herein relate to an apparatus for wireless communication. The apparatus may include means for transmitting, to each receiver device of a plurality of receiver devices communicating with the apparatus over a wideband channel using FDM, an indication of a bandwidth portion of the wideband channel to be used by the receiver device for performing measurements associated with a non-linear model of the apparatus. The apparatus may include means for transmitting, to each receiver device of the plurality of receiver devices, one or more wideband reference signals associated with training the non-linear model. The apparatus may include means for receiving a plurality of DPD coefficients, each DPD coefficient of the plurality of DPD coefficients being received from a receiver device of the plurality of receiver devices and being based at least in part on a channel estimation measurement or a channel equalization measurement associated with the one or more wideband reference signals and a respective bandwidth portion of the wideband channel. The apparatus may include means for obtaining a set of DPD coefficients based at least in part on combining the plurality of DPD coefficients received from the plurality of receiver devices. The apparatus may include means for performing DPD processing in accordance with the set of DPD coefficients.

Some aspects described herein relate to an apparatus for wireless communication. The apparatus may include means for receiving, from a transmitter device, an indication of a bandwidth portion of a wideband channel to be used by the apparatus for performing measurements associated with a non-linear model of the transmitter device. The apparatus may include means for receiving, from the transmitter device, one or more wideband reference signals associated with training the non-linear model. The apparatus may include means for obtaining a DPD coefficient based at least in part on performing a channel estimation measurement or a channel equalization measurement associated with the one or more wideband reference signals and within the bandwidth portion. The apparatus may include means for transmitting, to the transmitter device, the DPD coefficient.

Aspects generally include a method, apparatus, system, computer program product, non-transitory computer-readable medium, user equipment, base station, network entity, network node, wireless communication device, and/or processing system as substantially described herein with reference to and as illustrated by the drawings.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages, will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, and/or artificial intelligence devices). Aspects may be implemented in chip-level components, modular components, non-modular components, non-chip-level components, device-level components, and/or system-level components. Devices incorporating described aspects and features may include additional components and features for implementation and practice of claimed and described aspects. For example, transmission and reception of wireless signals may include one or more components for analog and digital purposes (e.g., hardware components including antennas, radio frequency (RF) chains, power amplifiers, modulators, buffers, processors, interleavers, adders, and/or summers). It is intended that aspects described herein may be practiced in a wide variety of devices, components, systems, distributed arrangements, and/or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Figure 1:
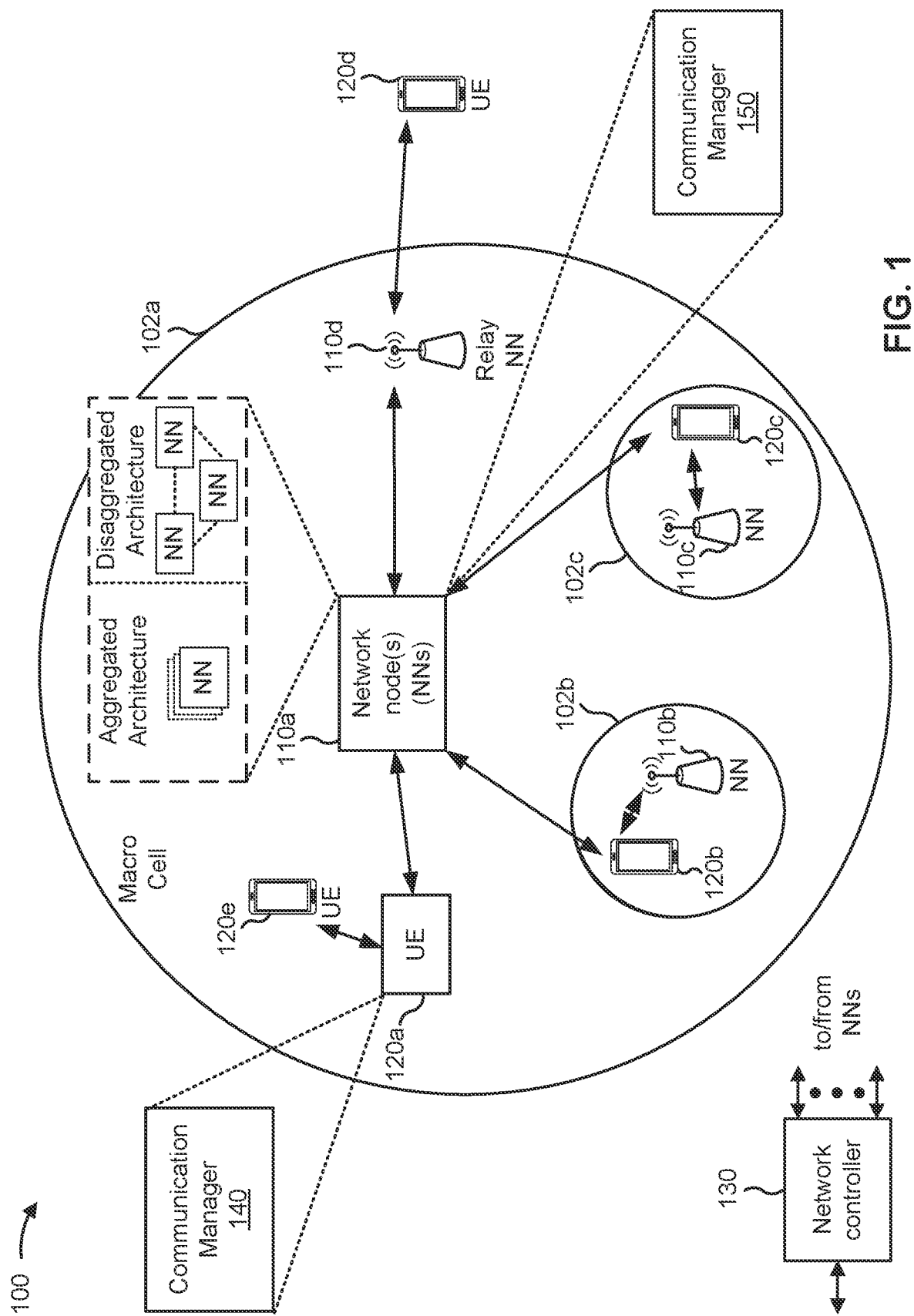
FIG. 1 is a diagram illustrating an example of a wireless network, in accordance with the present disclosure.

Various aspects relate generally to wireless communications. Some aspects more specifically relate to digital pre-distortion (DPD) signaling for frequency division multiplexed communications associated with a plurality of receiver devices. In some examples, a transmitter device may transmit, to a plurality of receiver devices communicating with the transmitter device over a wideband channel using frequency division multiplexing (FDM), an indication of a bandwidth portion of the wideband channel to be used by each receiver device for performing measurements associated with a non-linear model of the transmitter device. For example, the transmitter device may transmit, to a first receiver device of the plurality of receiver devices, an indication of a first bandwidth portion (e.g., a first bandwidth chunk) of the wideband channel to be used by the first receiver device for performing measurements associated with the non-linear model, and may transmit, to a second receiver device of the plurality of receiver devices, an indication of a second bandwidth portion to be used by the second receiver device for performing measurements associated with the non-linear model. The transmitter device may transmit, to each receiver device of the plurality of receiver devices, one or more wideband reference signals associated with training the non-linear model. For example, the transmitter device may transmit one or more wideband reference signals (e.g., the same one or more wideband reference signals) to the first receiver device and the second receiver device to be used by the first receiver device and the second receiver device for performing measurements associated with training the non-linear model. Each receiver device may generate a DPD coefficient based at least in part on performing a measurement (e.g., a channel estimation measurement and/or a channel equalization measurement) using the one or more wideband reference signals and within the respective bandwidth portion associated with the receiver device. Each receiver device may transmit a DPD coefficient to the transmitter device based at least in part on the respective measurements performed by the receiver device. The transmitter device may receive a plurality of DPD coefficients from the plurality of receiver devices, generate a set of DPD coefficients based at least in part on combining the plurality of DPD coefficients, and perform DPD processing in accordance with the set of DPD coefficients.

Particular aspects of the subject matter described in this disclosure can be implemented to realize one or more of the following potential advantages. In some examples, by allocating a plurality of bandwidth portions (e.g., bandwidth chunks) of a wideband channel to a plurality of receiver devices, each receiver device may perform reference signal measurements within a respective bandwidth portion of the wideband channel and may generate a DPD coefficient to be used for training a non-linear model at the transmitter device. In some examples, by combining the plurality of DPD coefficients from the plurality of receiver devices, where each DPD coefficient is received from a receiver device that generates the DPD coefficient in accordance with a reference signal measurement performed within a respective bandwidth portion, the transmitter device may train a non-linear model with increased accuracy. The non-linear model may be used by the transmitter device to improve communication efficiency, for example, for communications that include a large array of elements and/or a large number of receiver devices in a far-field, thereby reducing network energy usage. These examples, among others, are described in more detail below.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

While aspects may be described herein using terminology commonly associated with a 5G or New Radio (NR) radio access technology (RAT), aspects of the present disclosure can be applied to other RATs, such as a 3G RAT, a 4G RAT, and/or a RAT subsequent to 5G (e.g., 6G).

FIG. 1 is a diagram illustrating an example of a wireless network 100, in accordance with the present disclosure. The wireless network 100 may be or may include elements of a 5G (e.g., NR) network and/or a 4G (e.g., Long Term Evolution (LTE)) network, among other examples. The wireless network 100 may include one or more network nodes 110 (shown as a network node 110a, a network node 110b, a network node 110c, and a network node 110d), a user equipment (UE) 120 or multiple UEs 120 (shown as a UE 120a, a UE 120b, a UE 120c, a UE 120d, and a UE 120e), and/or other entities. A network node 110 is a network node that communicates with UEs 120. As shown, a network node 110 may include one or more network nodes. For example, a network node 110 may be an aggregated network node, meaning that the aggregated network node is configured to utilize a radio protocol stack that is physically or logically integrated within a single radio access network (RAN) node (e.g., within a single device or unit). As another example, a network node 110 may be a disaggregated network node (sometimes referred to as a disaggregated base station), meaning that the network node 110 is configured to utilize a protocol stack that is physically or logically distributed among two or more nodes (such as one or more central units (CUs), one or more distributed units (DUs), or one or more radio units (RUs)).

In some examples, a network node 110 is or includes a network node that communicates with UEs 120 via a radio access link, such as an RU. In some examples, a network node 110 is or includes a network node that communicates with other network nodes 110 via a fronthaul link or a midhaul link, such as a DU. In some examples, a network node 110 is or includes a network node that communicates with other network nodes 110 via a midhaul link or a core network via a backhaul link, such as a CU. In some examples, a network node 110 (such as an aggregated network node 110 or a disaggregated network node 110) may include multiple network nodes, such as one or more RUs, one or more CUs, and/or one or more DUs. A network node 110 may include, for example, an NR base station, an LTE base station, a Node B, an eNB (e.g., in 4G), a gNB (e.g., in 5G), an access point, a transmission reception point (TRP), a DU, an RU, a CU, a mobility element of a network, a core network node, a network element, a network equipment, a RAN node, or a combination thereof. In some examples, the network nodes 110 may be interconnected to one another or to one or more other network nodes 110 in the wireless network 100 through various types of fronthaul, midhaul, and/or backhaul interfaces, such as a direct physical connection, an air interface, or a virtual network, using any suitable transport network.

In some examples, a network node 110 may provide communication coverage for a particular geographic area. In the Third Generation Partnership Project (3GPP), the term "cell" can refer to a coverage area of a network node 110 and/or a network node subsystem serving this coverage area, depending on the context in which the term is used. A network node 110 may provide communication coverage for a macro cell, a pico cell, a femto cell, and/or another type of cell. A macro cell may cover a relatively large geographic area (e.g., several kilometers in radius) and may allow unrestricted access by UEs 120 with service subscriptions. A pico cell may cover a relatively small geographic area and may allow unrestricted access by UEs 120 with service subscriptions. A femto cell may cover a relatively small geographic area (e.g., a home) and may allow restricted access by UEs 120 having association with the femto cell (e.g., UEs 120 in a closed subscriber group (CSG)). A network node 110 for a macro cell may be referred to as a macro network node. A network node 110 for a pico cell may be referred to as a pico network node. A network node 110 for a femto cell may be referred to as a femto network node or an in-home network node. In the example shown in FIG. 1, the network node 110a may be a macro network node for a macro cell 102a, the network node 110b may be a pico network node for a pico cell 102b, and the network node 110c may be a femto network node for a femto cell 102c. A network node may support one or multiple (e.g., three) cells. In some examples, a cell may not necessarily be stationary, and the geographic area of the cell may move according to the location of a network node 110 that is mobile (e.g., a mobile network node).

In some aspects, the terms "base station" or "network node" may refer to an aggregated base station, a disaggregated base station, an integrated access and backhaul (IAB) node, a relay node, or one or more components thereof. For example, in some aspects, "base station" or "network node" may refer to a CU, a DU, an RU, a Near-Real Time (Near-RT) RAN Intelligent Controller (RIC), or a Non-Real Time (Non-RT) RIC, or a combination thereof. In some aspects, the terms "base station" or "network node" may refer to one device configured to perform one or more functions, such as those described herein in connection with the network node 110. In some aspects, the terms "base station" or "network node" may refer to a plurality of devices configured to perform the one or more functions. For example, in some distributed systems, each of a quantity of different devices (which may be located in the same geographic location or in different geographic locations) may be configured to perform at least a portion of a function, or to duplicate performance of at least a portion of the function, and the terms "base station" or "network node" may refer to any one or more of those different devices. In some aspects, the terms "base station" or "network node" may refer to one or more virtual base stations or one or more virtual base station functions. For example, in some aspects, two or more base station functions may be instantiated on a single device. In some aspects, the terms "base station" or "network node" may refer to one of the base station functions and not another. In this way, a single device may include more than one base station.

The wireless network 100 may include one or more relay stations. A relay station is a network node that can receive a transmission of data from an upstream node (e.g., a network node 110 or a UE 120) and send a transmission of the data to a downstream node (e.g., a UE 120 or a network node 110). A relay station may be a UE 120 that can relay transmissions for other UEs 120. In the example shown in FIG. 1, the network node 110d (e.g., a relay network node) may communicate with the network node 110a (e.g., a macro network node) and the UE 120d in order to facilitate communication between the network node 110a and the UE 120d. A network node 110 that relays communications may be referred to as a relay station, a relay base station, a relay network node, a relay node, a relay, or the like.

The wireless network 100 may be a heterogeneous network that includes network nodes 110 of different types, such as macro network nodes, pico network nodes, femto network nodes, relay network nodes, or the like. These different types of network nodes 110 may have different transmit power levels, different coverage areas, and/or different impacts on interference in the wireless network 100. For example, macro network nodes may have a high transmit power level (e.g., 5 to 40 watts) whereas pico network nodes, femto network nodes, and relay network nodes may have lower transmit power levels (e.g., 0.1 to 2 watts).

A network controller 130 may couple to or communicate with a set of network nodes 110 and may provide coordination and control for these network nodes 110. The network controller 130 may communicate with the network nodes 110 via a backhaul communication link or a midhaul communication link. The network nodes 110 may communicate with one another directly or indirectly via a wireless or wireline backhaul communication link. In some aspects, the network controller 130 may be a CU or a core network device, or may include a CU or a core network device.

The UEs 120 may be dispersed throughout the wireless network 100, and each UE 120 may be stationary or mobile. A UE 120 may include, for example, an access terminal, a terminal, a mobile station, and/or a subscriber unit. A UE 120 may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (e.g., a smart watch, smart clothing, smart glasses, a smart wristband, smart jewelry (e.g., a smart ring or a smart bracelet)), an entertainment device (e.g., a music device, a video device, and/or a satellite radio), a vehicular component or sensor, a smart meter/sensor, industrial manufacturing equipment, a global positioning system device, a UE function of a network node, and/or any other suitable device that is configured to communicate via a wireless or wired medium.

Some UEs 120 may be considered machine-type communication (MTC) or evolved or enhanced machine-type communication (eMTC) UEs. An MTC UE and/or an eMTC UE may include, for example, a robot, an unmanned aerial vehicle, a remote device, a sensor, a meter, a monitor, and/or a location tag, that may communicate with a network node, another device (e.g., a remote device), or some other entity. Some UEs 120 may be considered Internet-of-Things (IoT) devices, and/or may be implemented as NB-IoT (narrowband IoT) devices. Some UEs 120 may be considered a Customer Premises Equipment. A UE 120 may be included inside a housing that houses components of the UE 120, such as processor components and/or memory components. In some examples, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks 100 may be deployed in a given geographic area. Each wireless network 100 may support a particular RAT and may operate on one or more frequencies. A RAT may be referred to as a radio technology, an air interface, or the like. A frequency may be referred to as a carrier, a frequency channel, or the like. Each frequency may support a single RAT in a given geographic area in order to avoid interference between wireless networks of different RATs. In some cases, NR or 5G RAT networks may be deployed.

In some examples, two or more UEs 120 (e.g., shown as UE 120a and UE 120e) may communicate directly using one or more sidelink channels (e.g., without using a network node 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, or a vehicle-to-pedestrian (V2P) protocol), and/or a mesh network. In such examples, a UE 120 may perform scheduling operations, resource selection operations, and/or other operations described elsewhere herein as being performed by the network node 110.

Devices of the wireless network 100 may communicate using the electromagnetic spectrum, which may be subdivided by frequency or wavelength into various classes, bands, channels, or the like. For example, devices of the wireless network 100 may communicate using one or more operating bands. In 5G NR, two initial operating bands have been identified as frequency range designations FR1 (410 MHz-7.125 GHz) and FR2 (24.25 GHz-52.6 GHz). It should be understood that although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF)

band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above examples in mind, unless specifically stated otherwise, it should be understood that the term "sub-6 GHz" or the like, if used herein, may broadly represent frequencies that may be less than 6 GHz, may be within FR1, or may include mid-band frequencies. Further, unless specifically stated otherwise, it should be understood that the term "millimeter wave" or the like, if used herein, may broadly represent frequencies that may include mid-band frequencies, may be within FR2, FR4, FR4-a or FR4-1, and/or FR5, or may be within the EHF band. It is contemplated that the frequencies included in these operating bands (e.g., FR1, FR2, FR3, FR4, FR4-a, FR4-1, and/or FR5) may be modified, and techniques described herein are applicable to those modified frequency ranges.

In some aspects, the UE 120 may include a communication manager 140. In some aspects, as described in more detail elsewhere herein, the communication manager 140 may transmit, to each receiver device of a plurality of receiver devices communicating with the UE over a wideband channel using frequency division multiplexing (FDM), an indication of a bandwidth portion of the wideband channel to be used by the receiver device for performing measurements associated with a non-linear model of the UE; transmit, to each receiver device of the plurality of receiver devices, one or more wideband reference signals associated with training the non-linear model; receive a plurality of digital pre-distortion (DPD) coefficients, each DPD coefficient of the plurality of DPD coefficients being received from a receiver device of the plurality of receiver devices and being based at least in part on a channel estimation measurement or a channel equalization measurement associated with the one or more wideband reference signals and a respective bandwidth portion of the wideband channel; obtain a set of DPD coefficients based at least in part on combining the plurality of DPD coefficients received from the plurality of receiver devices; and perform DPD processing in accordance with the set of DPD coefficients. In some other aspects, as described in more detail elsewhere herein, the communication manager 140 may receive, from a transmitter device, an indication of a bandwidth portion of a wideband channel to be used by the UE for performing measurements associated with a non-linear model of the transmitter device; receive, from the transmitter device, one or more wideband reference signals associated with training the non-linear model; obtain a DPD coefficient based at least in part on performing a channel estimation measurement or a channel equalization measurement associated with the one or more wideband reference signals and within the bandwidth portion; and transmit, to the transmitter device, the DPD coefficient. Additionally, or alternatively, the communication manager 140 may perform one or more other operations described herein.

In some aspects, the network node 110 may include a communication manager 150. In some aspects, as described in more detail elsewhere herein, the communication manager 150 may transmit, to each receiver device of a plurality of receiver devices communicating with the network node over a wideband channel using FDM, an indication of a bandwidth portion of the wideband channel to be used by the receiver device for performing measurements associated with a non-linear model of the network node; transmit, to each receiver device of the plurality of receiver devices, one or more wideband reference signals associated with training the non-linear model; receive a plurality of DPD coefficients, each DPD coefficient of the plurality of DPD coefficients being received from a receiver device of the plurality of receiver devices and being based at least in part on a channel estimation measurement or a channel equalization measurement associated with the one or more wideband reference signals and a respective bandwidth portion of the wideband channel; obtain a set of DPD coefficients based at least in part on combining the plurality of DPD coefficients received from the plurality of receiver devices; and perform DPD processing in accordance with the set of DPD coefficients. In some other aspects, as described in more detail elsewhere herein, the communication manager 150 may receive, from a transmitter device, an indication of a bandwidth portion of a wideband channel to be used by the network node for performing measurements associated with a non-linear model of the transmitter device; receive, from the transmitter device, one or more wideband reference signals associated with training the non-linear model; obtain a DPD coefficient based at least in part on performing a channel estimation measurement or a channel equalization measurement associated with the one or more wideband reference signals and within the bandwidth portion; and transmit, to the transmitter device, the DPD coefficient. Additionally, or alternatively, the communication manager 150 may perform one or more other operations described herein.

As indicated above, FIG. 1 is provided as an example. Other examples may differ from what is described with regard to FIG. 1.

Figure 2:
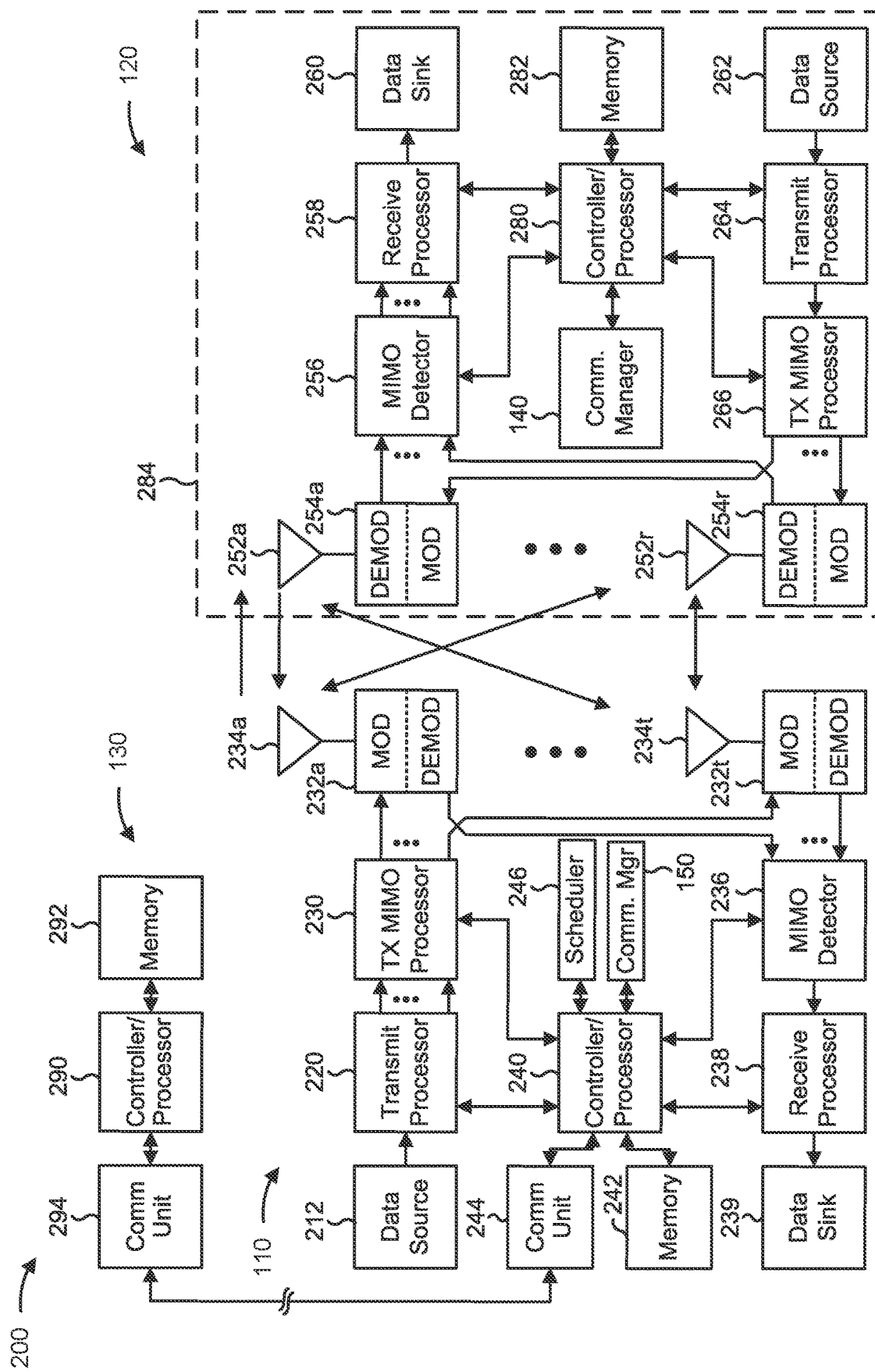
FIG. 2 is a diagram illustrating an example of a network node in communication with a user equipment (UE) in a wireless network, in accordance with the present disclosure.

FIG. 2 is a diagram illustrating an example 200 of a network node 110 in communication with a UE 120 in a wireless network 100, in accordance with the present disclosure. The network node 110 may be equipped with a set of antennas 234a through 234t, such as T antennas (T≥1). The UE 120 may be equipped with a set of antennas 252a through 252r, such as R antennas (R≥1). The network node 110 of example 200 includes one or more radio frequency components, such as antennas 234 and a modem 232. In some examples, a network node 110 may include an interface, a communication component, or another component that facilitates communication with the UE 120 or another network node. Some network nodes 110 may not include radio frequency components that facilitate direct communication with the UE 120, such as one or more CUs, or one or more DUs.

At the network node 110, a transmit processor 220 may receive data, from a data source 212, intended for the UE 120 (or a set of UEs 120). The transmit processor 220 may select one or more modulation and coding schemes (MCSs) for the UE 120 based at least in part on one or more channel quality indicators (CQIs) received from that UE 120. The network node 110 may process (e.g., encode and modulate)

the data for the UE 120 based at least in part on the MCS(s) selected for the UE 120 and may provide data symbols for the UE 120. The transmit processor 220 may process system information (e.g., for semi-static resource partitioning information (SRPI)) and control information (e.g., CQI requests, grants, and/or upper layer signaling) and provide overhead symbols and control symbols. The transmit processor 220 may generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide a set of output symbol streams (e.g., T output symbol streams) to a corresponding set of modems 232 (e.g., T modems), shown as modems 232a through 232t. For example, each output symbol stream may be provided to a modulator component (shown as MOD) of a modem 232. Each modem 232 may use a respective modulator component to process a respective output symbol stream (e.g., for OFDM) to obtain an output sample stream. Each modem 232 may further use a respective modulator component to process (e.g., convert to analog, amplify, filter, and/or upconvert) the output sample stream to obtain a downlink signal. The modems 232a through 232t may transmit a set of downlink signals (e.g., T downlink signals) via a corresponding set of antennas 234 (e.g., T antennas), shown as antennas 234a through 234t.

At the UE 120, a set of antennas 252 (shown as antennas 252a through 252r) may receive the downlink signals from the network node 110 and/or other network nodes 110 and may provide a set of received signals (e.g., R received signals) to a set of modems 254 (e.g., R modems), shown as modems 254a through 254r. For example, each received signal may be provided to a demodulator component (shown as DEMOD) of a modem 254. Each modem 254 may use a respective demodulator component to condition (e.g., filter, amplify, downconvert, and/or digitize) a received signal to obtain input samples. Each modem 254 may use a demodulator component to further process the input samples (e.g., for OFDM) to obtain received symbols. A MIMO detector 256 may obtain received symbols from the modems 254, may perform MIMO detection on the received symbols if applicable, and may provide detected symbols. A receive processor 258 may process (e.g., demodulate and decode) the detected symbols, may provide decoded data for the UE 120 to a data sink 260, and may provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a CQI parameter, among other examples. In some examples, one or more components of the UE 120 may be included in a housing 284.

The network controller 130 may include a communication unit 294, a controller/processor 290, and a memory 292. The network controller 130 may include, for example, one or more devices in a core network. The network controller 130 may communicate with the network node 110 via the communication unit 294.

One or more antennas (e.g., antennas 234a through 234t and/or antennas 252a through 252r) may include, or may be included within, one or more antenna panels, one or more antenna groups, one or more sets of antenna elements, and/or one or more antenna arrays, among other examples. An antenna panel, an antenna group, a set of antenna elements, and/or an antenna array may include one or more antenna elements (within a single housing or multiple housings), a set of coplanar antenna elements, a set of non-coplanar antenna elements, and/or one or more antenna elements coupled to one or more transmission and/or reception components, such as one or more components of FIG. 2.

On the uplink, at the UE 120, a transmit processor 264 may receive and process data from a data source 262 and control information (e.g., for reports that include RSRP, RSSI, RSRQ, and/or CQI) from the controller/processor 280. The transmit processor 264 may generate reference symbols for one or more reference signals. The symbols from the transmit processor 264 may be precoded by a TX MIMO processor 266 if applicable, further processed by the modems 254 (e.g., for DFT-s-OFDM or CP-OFDM), and transmitted to the network node 110. In some examples, the modem 254 of the UE 120 may include a modulator and a demodulator. In some examples, the UE 120 includes a transceiver. The transceiver may include any combination of the antenna(s) 252, the modem(s) 254, the MIMO detector 256, the receive processor 258, the transmit processor 264, and/or the TX MIMO processor 266. The transceiver may be used by a processor (e.g., the controller/processor 280) and the memory 282 to perform aspects of any of the methods described herein (e.g., with reference to FIGS. 6-11).

At the network node 110, the uplink signals from UE 120 and/or other UEs may be received by the antennas 234, processed by the modem 232 (e.g., a demodulator component, shown as DEMOD, of the modem 232), detected by a MIMO detector 236 if applicable, and further processed by a receive processor 238 to obtain decoded data and control information sent by the UE 120. The receive processor 238 may provide the decoded data to a data sink 239 and provide the decoded control information to the controller/processor 240. The network node 110 may include a communication unit 244 and may communicate with the network controller 130 via the communication unit 244. The network node 110 may include a scheduler 246 to schedule one or more UEs 120 for downlink and/or uplink communications. In some examples, the modem 232 of the network node 110 may include a modulator and a demodulator. In some examples, the network node 110 includes a transceiver. The transceiver may include any combination of the antenna(s) 234, the modem(s) 232, the MIMO detector 236, the receive processor 238, the transmit processor 220, and/or the TX MIMO processor 230. The transceiver may be used by a processor (e.g., the controller/processor 240) and the memory 242 to perform aspects of any of the methods described herein (e.g., with reference to FIGS. 6-11).

The controller/processor 240 of the network node 110, the controller/processor 280 of the UE 120, and/or any other component(s) of FIG. 2 may perform one or more techniques associated with DPD signaling, as described in more detail elsewhere herein. For example, the controller/processor 240 of the network node 110, the controller/processor 280 of the UE 120, and/or any other component(s) of FIG. 2 may perform or direct operations of, for example, process 800 of FIG. 8, process 900 of FIG. 9, and/or other processes as described herein. The memory 242 and the memory 282 may store data and program codes for the network node 110 and the UE 120, respectively. In some examples, the memory 242 and/or the memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the network node 110 and/or the UE 120, may cause the one or more processors, the UE 120, and/or the network node 110 to perform or direct operations of, for example, process 800 of FIG. 8, process 900 of FIG. 9, and/or other processes as described herein. In some examples, executing instructions may include running the instructions, converting the instructions, compiling the instructions, and/or interpreting the instructions, among other examples.

In some aspects, the transmitter device (e.g., the UE 120 or the network node 110) includes means for transmitting, to each receiver device of a plurality of receiver devices communicating with the transmitter device over a wideband channel using FDM, an indication of a bandwidth portion of the wideband channel to be used by the receiver device for performing measurements associated with a non-linear model of the transmitter device; means for transmitting, to each receiver device of the plurality of receiver devices, one or more wideband reference signals associated with training the non-linear model; means for receiving a plurality of DPD coefficients, each DPD coefficient of the plurality of DPD coefficients being received from a receiver device of the plurality of receiver devices and being based at least in part on a channel estimation measurement or a channel equalization measurement associated with the one or more wideband reference signals and a respective bandwidth portion of the wideband channel; means for obtaining a set of DPD coefficients based at least in part on combining the plurality of DPD coefficients received from the plurality of receiver devices; and/or means for performing DPD processing in accordance with the set of DPD coefficients. In some aspects, the means for the transmitter device to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246. In some aspects, the means for the transmitter device to perform operations described herein may include, for example, one or more of communication manager 140, antenna 252, modem 254, MIMO detector 256, receive processor 258, transmit processor 264, TX MIMO processor 266, controller/processor 280, or memory 282.

In some aspects, the receiver device (e.g., the UE 120 or the network node 110) includes means for receiving, from a transmitter device, an indication of a bandwidth portion of a wideband channel to be used by the receiver device for performing measurements associated with a non-linear model of the transmitter device; means for receiving, from the transmitter device, one or more wideband reference signals associated with training the non-linear model; means for obtaining a DPD coefficient based at least in part on performing a channel estimation measurement or a channel equalization measurement associated with the one or more wideband reference signals and within the bandwidth portion; and/or means for transmitting, to the transmitter device, the DPD coefficient. In some aspects, the means for the receiver device to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246. In some aspects, the means for the receiver device to perform operations described herein may include, for example, one or more of communication manager 140, antenna 252, modem 254, MIMO detector 256, receive processor 258, transmit processor 264, TX MIMO processor 266, controller/processor 280, or memory 282.

In some aspects, an individual processor may perform all of the functions described as being performed by the one or more processors. In some aspects, one or more processors may collectively perform a set of functions. For example, a first set of (one or more) processors of the one or more processors may perform a first function described as being performed by the one or more processors, and a second set of (one or more) processors of the one or more processors may perform a second function described as being performed by the one or more processors. The first set of processors and the second set of processors may be the same set of processors or may be different sets of processors. Reference to "one or more processors" should be understood to refer to any one or more of the processors described in connection with FIG. 2. Reference to "one or more memories" should be understood to refer to any one or more memories of a corresponding device, such as the memory described in connection with FIG. 2. For example, functions described as being performed by one or more memories can be performed by the same subset of the one or more memories or different subsets of the one or more memories.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

As indicated above, FIG. 2 is provided as an example. Other examples may differ from what is described with regard to FIG. 2.

Deployment of communication systems, such as 5G NR systems, may be arranged in multiple manners with various components or constituent parts. In a 5G NR system, or network, a network node, a network entity, a mobility element of a network, a RAN node, a core network node, a network element, a base station, or a network equipment may be implemented in an aggregated or disaggregated architecture. For example, a base station (such as a Node B (NB), an evolved NB (eNB), an NR base station, a 5G NB, an access point (AP), a TRP, or a cell, among other examples), or one or more units (or one or more components) performing base station functionality, may be implemented as an aggregated base station (also known as a standalone base station or a monolithic base station) or a disaggregated base station. "Network entity" or "network node" may refer to a disaggregated base station, or to one or more units of a disaggregated base station (such as one or more CUs, one or more DUs, one or more RUs, or a combination thereof).

An aggregated base station (e.g., an aggregated network node) may be configured to utilize a radio protocol stack that is physically or logically integrated within a single RAN node (e.g., within a single device or unit). A disaggregated base station (e.g., a disaggregated network node) may be configured to utilize a protocol stack that is physically or logically distributed among two or more units (such as one or more CUs, one or more DUs, or one or more RUs). In some examples, a CU may be implemented within a network node, and one or more DUs may be co-located with the CU, or alternatively, may be geographically or virtually distributed throughout one or multiple other network nodes. The DUs may be implemented to communicate with one or more RUs. Each of the CU, DU, and RU also can be implemented as virtual units, such as a virtual central unit (VCU), a virtual distributed unit (VDU), or a virtual radio unit (VRU), among other examples.

Base station-type operation or network design may consider aggregation characteristics of base station functionality. For example, disaggregated base stations may be utilized in an IAB network, an open radio access network (O-RAN (such as the network configuration sponsored by the O-RAN Alliance)), or a virtualized radio access network (vRAN, also known as a cloud radio access network (C-RAN)) to facilitate scaling of communication systems by separating base station functionality into one or more units that can be individually deployed. A disaggregated base station may include functionality implemented across two or more units at various physical locations, as well as functionality implemented for at least one unit virtually, which can enable flexibility in network design. The various units of the disaggregated base station can be configured for wired or wireless communication with at least one other unit of the disaggregated base station.

Figure 3:
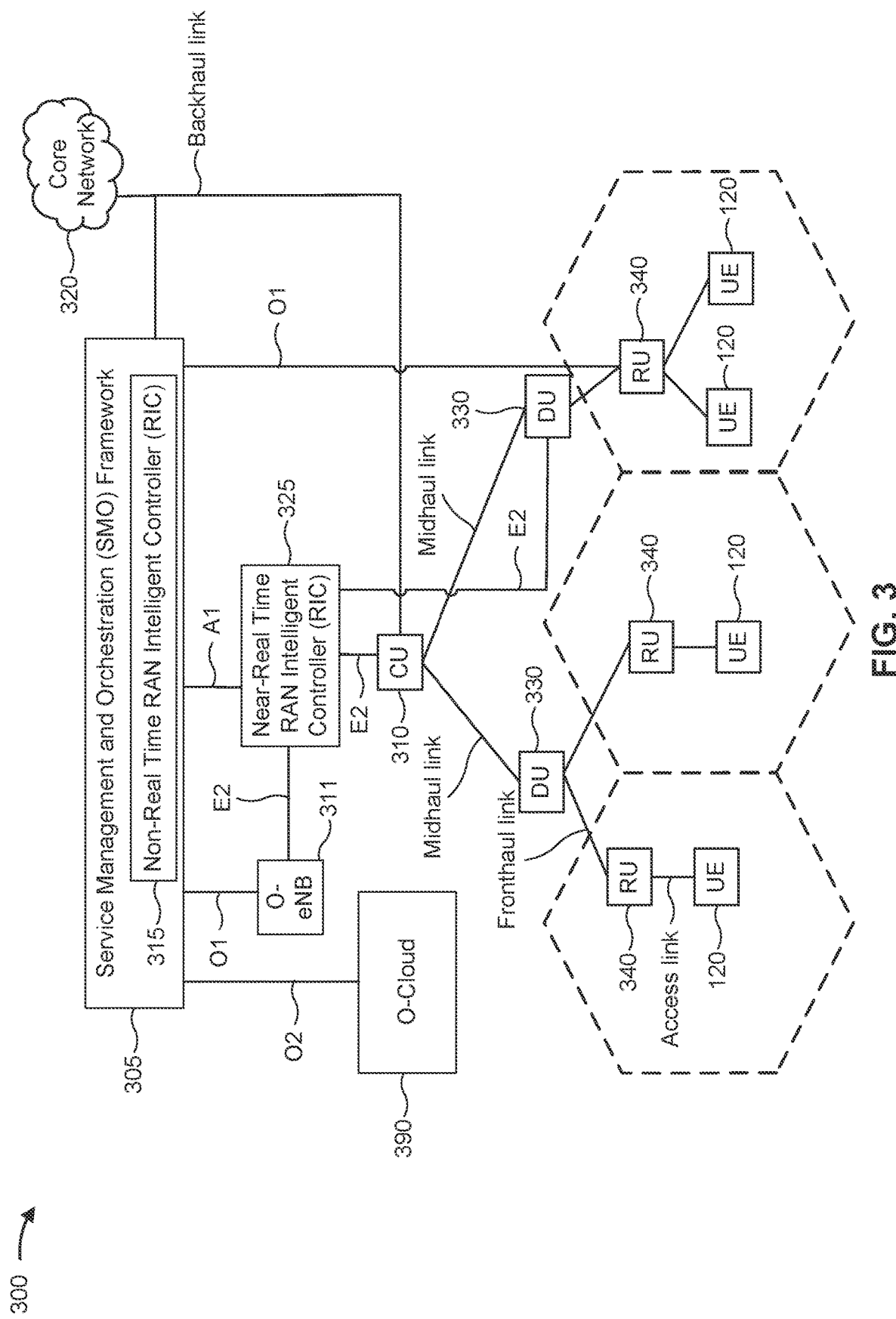
FIG. 3 is a diagram illustrating an example disaggregated base station architecture, in accordance with the present disclosure.

FIG. 3 is a diagram illustrating an example disaggregated base station architecture 300, in accordance with the present disclosure. The disaggregated base station architecture 300 may include a CU 310 that can communicate directly with a core network 320 via a backhaul link, or indirectly with the core network 320 through one or more disaggregated control units (such as a Near-RT RIC 325 via an E2 link, or a Non-RT RIC 315 associated with a Service Management and Orchestration (SMO) Framework 305, or both). A CU 310 may communicate with one or more DUs 330 via respective midhaul links, such as through F1 interfaces. Each of the DUs 330 may communicate with one or more RUs 340 via respective fronthaul links. Each of the RUs 340 may communicate with one or more UEs 120 via respective radio frequency (RF) access links. In some implementations, a UE 120 may be simultaneously served by multiple RUs 340.

Each of the units, including the CUs 310, the DUs 330, the RUs 340, as well as the Near-RT RICs 325, the Non-RT RICs 315, and the SMO Framework 305, may include one or more interfaces or be coupled with one or more interfaces configured to receive or transmit signals, data, or information (collectively, signals) via a wired or wireless transmission medium. Each of the units, or an associated processor or controller providing instructions to one or multiple communication interfaces of the respective unit, can be configured to communicate with one or more of the other units via the transmission medium. In some examples, each of the units can include a wired interface, configured to receive or transmit signals over a wired transmission medium to one or more of the other units, and a wireless interface, which may include a receiver, a transmitter or transceiver (such as an RF transceiver), configured to receive or transmit signals, or both, over a wireless transmission medium to one or more of the other units.

In some aspects, the CU 310 may host one or more higher layer control functions. Such control functions can include radio resource control (RRC) functions, packet data convergence protocol (PDCP) functions, or service data adaptation protocol (SDAP) functions, among other examples. Each control function can be implemented with an interface configured to communicate signals with other control functions hosted by the CU 310. The CU 310 may be configured to handle user plane functionality (for example, Central Unit-User Plane (CU-UP) functionality), control plane functionality (for example, Central Unit-Control Plane (CU-CP) functionality), or a combination thereof. In some implementations, the CU 310 can be logically split into one or more CU-UP units and one or more CU-CP units. A CU-UP unit can communicate bidirectionally with a CU-CP unit via an interface, such as the E1 interface when implemented in an O-RAN configuration. The CU 310 can be implemented to communicate with a DU 330, as necessary, for network control and signaling.

Each DU 330 may correspond to a logical unit that includes one or more base station functions to control the operation of one or more RUs 340. In some aspects, the DU 330 may host one or more of a radio link control (RLC) layer, a medium access control (MAC) layer, and one or more high physical (PHY) layers depending, at least in part, on a functional split, such as a functional split defined by the 3GPP. In some aspects, the one or more high PHY layers may be implemented by one or more modules for forward error correction (FEC) encoding and decoding, scrambling, and modulation and demodulation, among other examples. In some aspects, the DU 330 may further host one or more low PHY layers, such as implemented by one or more modules for a fast Fourier transform (FFT), an inverse FFT (iFFT), digital beamforming, or physical random access channel (PRACH) extraction and filtering, among other examples. Each layer (which also may be referred to as a module) can be implemented with an interface configured to communicate signals with other layers (and modules) hosted by the DU 330, or with the control functions hosted by the CU 310.

Each RU 340 may implement lower-layer functionality. In some deployments, an RU 340, controlled by a DU 330, may correspond to a logical node that hosts RF processing functions or low-PHY layer functions, such as performing an FFT, performing an iFFT, digital beamforming, or PRACH extraction and filtering, among other examples, based on a functional split (for example, a functional split defined by the 3GPP), such as a lower layer functional split. In such an architecture, each RU 340 can be operated to handle over the air (OTA) communication with one or more UEs 120. In some implementations, real-time and non-real-time aspects of control and user plane communication with the RU(s) 340 can be controlled by the corresponding DU 330. In some scenarios, this configuration can enable each DU 330 and the CU 310 to be implemented in a cloud-based RAN architecture, such as a vRAN architecture.

The SMO Framework 305 may be configured to support RAN deployment and provisioning of non-virtualized and virtualized network elements. For non-virtualized network elements, the SMO Framework 305 may be configured to support the deployment of dedicated physical resources for RAN coverage requirements, which may be managed via an operations and maintenance interface (such as an O1 interface).

For virtualized network elements, the SMO Framework 305 may be configured to interact with a cloud computing platform (such as an open cloud (O-Cloud) platform 390) to perform network element life cycle management (such as to instantiate virtualized network elements) via a cloud computing platform interface (such as an O2 interface). Such virtualized network elements can include, but are not limited to, CUs 310, DUs 330, RUs 340, non-RT RICs 315, and Near-RT RICs 325. In some implementations, the SMO Framework 305 can communicate with a hardware aspect of a 4G RAN, such as an open eNB (O-eNB) 311, via an O1 interface. Additionally, in some implementations, the SMO Framework 305 can communicate directly with each of one or more RUs 340 via a respective O1 interface. The SMO Framework 305 also may include a Non-RT RIC 315 configured to support functionality of the SMO Framework 305.

The Non-RT RIC 315 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC 325. The Non-RT RIC 315 may be coupled to or communicate with (such as via an A1 interface) the Near-RT RIC 325. The Near-RT RIC 325 may be configured to include a logical function that enables near-real-time control and optimization of RAN elements and resources via data collection and actions over an interface (such as via an E2 interface) connecting one or more CUs 310, one or more DUs 330, or both, as well as an O-eNB, with the Near-RT RIC 325.

In some implementations, to generate AI/ML models to be deployed in the Near-RT RIC 325, the Non-RT RIC 315 may receive parameters or external enrichment information from external servers. Such information may be utilized by the Near-RT RIC 325 and may be received at the SMO Framework 305 or the Non-RT RIC 315 from non-network data sources or from network functions. In some examples, the Non-RT RIC 315 or the Near-RT RIC 325 may be configured to tune RAN behavior or performance. For example, the Non-RT RIC 315 may monitor long-term trends and patterns for performance and employ AI/ML models to perform corrective actions through the SMO Framework 305 (such as reconfiguration via an O1 interface) or via creation of RAN management policies (such as A1 interface policies).

As indicated above, FIG. 3 is provided as an example. Other examples may differ from what is described with regard to FIG. 3.

Figure 4:
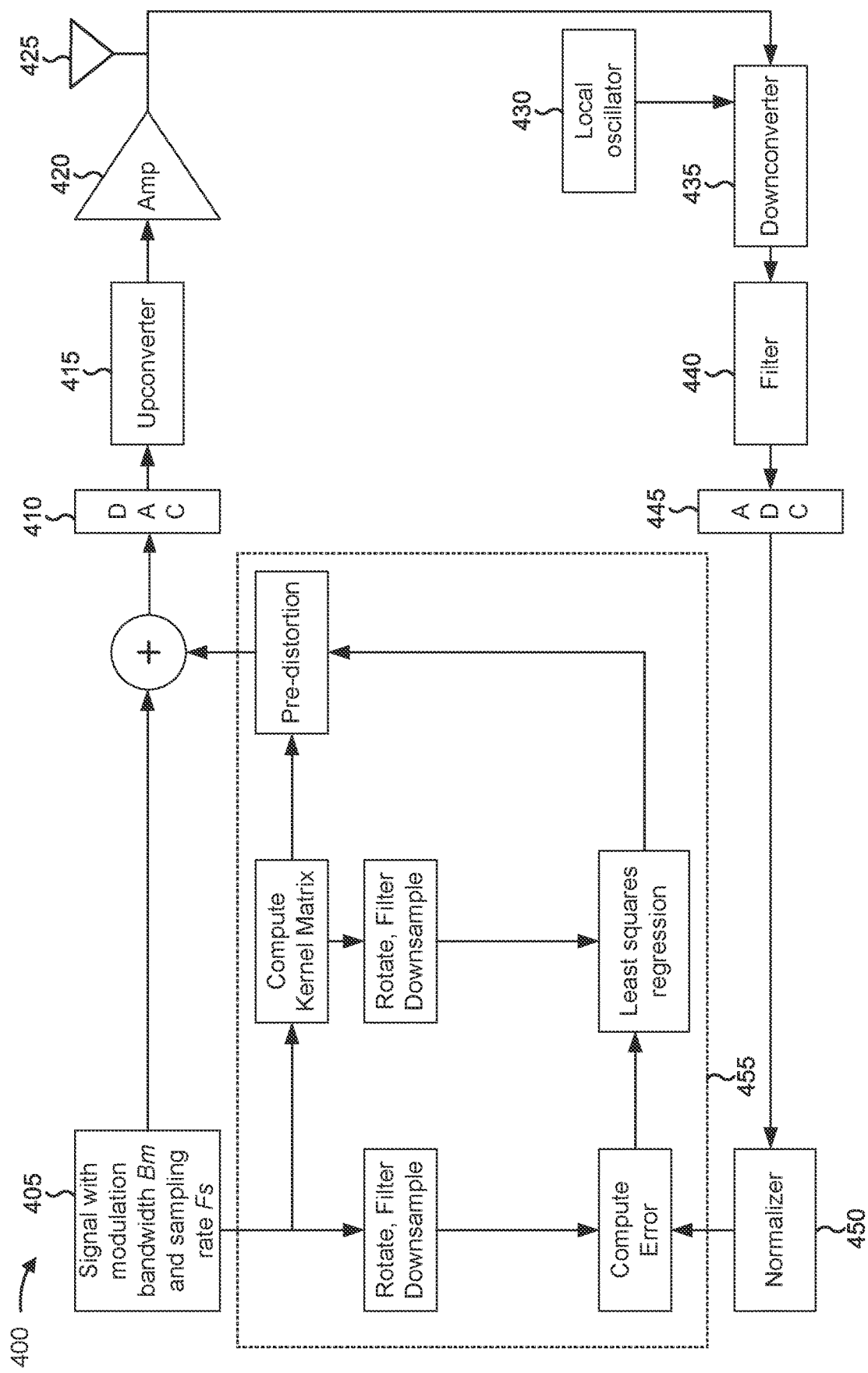
FIG. 4 is a diagram illustrating an example architecture for optimizing fractional bandwidth digital pre-distortion (DPD) in a time domain, in accordance with the present disclosure.

FIG. 4 is a diagram illustrating an example architecture 400 for optimizing 5G fractional bandwidth DPD in a time domain, in accordance with the present disclosure. Example 400 may be included in a transceiver chain of a UE (e.g., UE 120) and/or a transceiver chain of a base station (e.g., base station 110).

As shown in FIG. 4, a signal 405 may be modulated using a modulation bandwidth (e.g., represented by Bm) and may have an associated sampling rate (e.g., represented by Fs). For example, the modulation bandwidth Bm may be 2 GHz or higher for mmW communications in 5G. In some aspects, due to leakage into neighboring bands, the signal 405 may be transmitted in a total bandwidth (e.g., represented by Bd) that includes distortions in the neighboring bands. The total bandwidth may be greater than or equal to the modulation bandwidth (e.g., Bd≥Bm). For example, the total bandwidth Bd may be 10 GHz or higher for mmW communications in 5G. Similarly, the total bandwidth may be associated with a sampling rate (e.g., represented by Ds) that is larger than the associated sampling rate (e.g., Ds≥Fs).

The signal 405 may pass through a digital-to-analog converter (DAC) 410 and be upconverted to RF by an upconverter 415 before being amplified at a power amplifier 420. The power amplifier 420 may amplify an analog signal that is output from the upconverter 415 and is based at least in part on an analog signal output by the DAC 410 and corresponding to the signal 405. Accordingly, an antenna 425 may generate a transmit signal OTA based at least in part on the amplified analog signal from the power amplifier 420.

However, the power amplifier 420 may have non-linearities that introduce distortion into the transmit signal. The distortion may be included in portions of the amplified analog signal corresponding to the modulation bandwidth Bm and/or may include leakages into neighboring bands that are within the total bandwidth Bd. In order to compensate for these non-linearities, a local oscillator 430 may tune a downconverter 435 to receive the transmit signal corresponding to the signal 405. The local oscillator 430 may be included in a direct conversion receiver or an IF receiver. Although depicted separately from the downconverter 435, in some aspects, the local oscillator 430 may be at least partially integrated with the downconverter 435. In some aspects, the local oscillator 430 may be configured to cover a first fraction (e.g., represented by 1/N) of the total bandwidth Bd, such as a 400 MHz fraction of a 3600 MHz total bandwidth. For example, a controller associated with the local oscillator 430 may instruct the local oscillator to generate a tuning signal in order to tune the downconverter 435 to a central frequency within the first fraction and cover a range above and below the central frequency such that the range comprises the first fraction of the total bandwidth Bd. As a result, the local oscillator 430 may conserve power as compared with being configured to cover the total bandwidth Bd.

As further shown in FIG. 4, the downconverter 435 may provide input to an analog-to-digital converter (ADC) 445, where the input is based at least in part on the received transmit signal (corresponding to the signal 405). In some aspects, the input is further filtered by a filter 440 before being provided to the ADC 445. The ADC 445 (and optionally the filter 440) may sample at the first fraction of the total bandwidth and output a digital signal based at least in part on the input. For example, the ADC 445 (and optionally the downconverter 435 and/or the filter 440) may be configured to operate at a sampling rate corresponding to the first fraction (e.g., at a clock rate proportional to Ds/N, where Ds is the sampling rate corresponding to the total bandwidth). As a result, the ADC 445 (and optionally the downconverter 435 and/or the filter 440) may conserve power as compared with operating at a sampling rate corresponding to the total bandwidth Bd.

Accordingly, a processor 455 may determine an error associated with the signal 405 based at least in part on the digital signal output by the ADC 445. In some aspects, the digital signal is further normalized by a normalizer 450 before being provided to the processor 455.

As shown in FIG. 4, the processor 455 may determine the error based at least in part on a band error computed in a time domain. Accordingly, the processor 455 may refrain from applying an FFT and/or another transform to the digital signal output by the ADC 445 and to the signal 405. In some aspects, the signal 405 may be rotated, filtered, and/or down-sampled. For example, the processor 455 may rotate, filter, and/or down-sample the signal 405 based at least in part on the first fraction.

Accordingly, the processor 455 may determine the error, in the time domain, based at least in part on the signal 405 and the digital signal output by the ADC 445. In some aspects, the local oscillator 430 may be configured (e.g., by the controller) to shift to a second fraction of the total bandwidth. For example, the local oscillator 430 may generate a different tuning signal in order to tune the downconverter 435 to a central frequency within the second fraction and cover a range above and below the central frequency such that the range comprises the second fraction of the total bandwidth Bd. Accordingly, the ADC 445 may output a second digital signal based at least in part on sampling at the second fraction of the total bandwidth. Further, the processor 455 may determine the error based at least in part on the second digital signal output by the ADC 445. Thus, the processor 455 may determine the error iteratively as the local oscillator 430 shifts to different fractions of the total bandwidth.

In some aspects, the local oscillator 430 may shift over time such that the total bandwidth is covered incrementally. Accordingly, the processor 455 may determine the error based at least in part on outputs from the ADC 445 that represent the total bandwidth. As an alternative, the local oscillator 430 may shift over time such that a portion of the total bandwidth is covered. For example, the local oscillator 430 may be configured to cover a first fraction of the total bandwidth (e.g., frequencies from −600 MHz to −200 MHz of a reference frequency), shift to cover a second fraction of the total bandwidth (e.g., frequencies from +200 MHz to +600 MHz of the reference frequency), and not cover a third fraction of the total bandwidth (e.g., frequencies from −200 MHz to +200 MHz of the reference frequency). Accordingly, the processor 455 may determine the error based at least in part on outputs from the ADC 445 that represent a subset of the total bandwidth. As a result, the processor 455 may conserve power and reduce convergence time when running a least squares regression (e.g., as described below) as compared with using outputs from the ADC 445 that represent the total bandwidth.

In some aspects, the subset of the total bandwidth covered by the local oscillator 430 and the ADC 445 may vary. Additionally, or alternatively, the subset of the total bandwidth, covered by the local oscillator 430 and the ADC 445, may include a pattern of fractions of the total bandwidth.

In some aspects, a transceiver chain may use outputs that represent a subset of the total bandwidth even when using a local oscillator that covers the total bandwidth and/or an ADC configured to sample at a rate corresponding to the total bandwidth. Accordingly, a processor of that transceiver chain may still conserve power and reduce convergence time even when the local oscillator and/or the ADC consume additional power to cover the total bandwidth.

The processor 455 may further determine a digital pre-distortion to apply to new signals, before input to the DAC 410, using a least squares regression. For example, the least squares regression may use a kernel matrix based at least in part on the signal 405 and the determined error between the signal 405 and the amplified analog signal received by the downconverter 435. In some aspects, the kernel matrix may be rotated, filtered, and/or down-sampled before being used in the least squares regression. For example, the processor 455 may rotate, filter, and/or down-sample the kernel matrix based at least in part on the subset of the total bandwidth represented by outputs from the ADC 445.

In some aspects, the processor 455 may perform the least squares regression at a sub-rate corresponding to the first fraction of the total bandwidth. For example, the processor 455 may operate at a sampling rate corresponding to the first fraction (e.g., at a clock rate proportional to Ds/N, where Ds is the sampling rate corresponding to the total bandwidth). As a result, the processor 455 may conserve power as compared with operating at a sampling rate corresponding to the total bandwidth Bd.

In some aspects, a transceiver chain may perform least squares regressions at a sub-rate even when using a local oscillator that covers the total bandwidth and/or an ADC configured to sample at a rate corresponding to the total bandwidth. Accordingly, a processor of that transceiver chain may still conserve power even when the local oscillator and/or the ADC consume additional power to cover the total bandwidth.

The digital pre-distortion applied to new signals may reduce noise within the modulation bandwidth Bm caused by non-linearity of the amplifier 420 when the digital pre-distortion is applied at a rate equal to the modulation bandwidth. For example, the processor 455 may apply the digital pre-distortion to portions of the new signals corresponding to the modulation bandwidth Bm in analog. In some aspects, the digital pre-distortion applied to new signals may further reduce leakage outside the modulation bandwidth Bm but within the total bandwidth Bd caused by non-linearity of the amplifier 420 when the digital pre-distortion is applied at a rate greater than the modulation bandwidth. For example, the processor 455 may apply the digital pre-distortion to portions of the new signals corresponding to at least part of the total bandwidth Bd, that is larger than the modulation bandwidth Bm, in analog.

By using techniques as described in connection with FIG. 4, the local oscillator 430 and the ADC 445 may operate according to lower bandwidths. As a result, the local oscillator 430 and the ADC 445 conserve power, and digital pre-distortion can still be applied with high levels of accuracy to reduce noise and/or leakage. Additionally, or alternatively, the processor 455 may operate at a sub-rate proportional to lower bandwidths. As a result, the processor 455 conserves power, and digital pre-distortion can still be applied with high levels of accuracy to reduce noise and/or leakage. Additionally, or alternatively, the processor 455 may perform the least squares regression using a subset of a total bandwidth. As a result, the processor 455 conserves power and operates faster. Additionally, any decreases in accuracy for the digital pre-distortion are usually not significant.

As indicated above, FIG. 4 is provided as an example. Other examples may differ from what is described with respect to FIG. 4.

Figure 5:
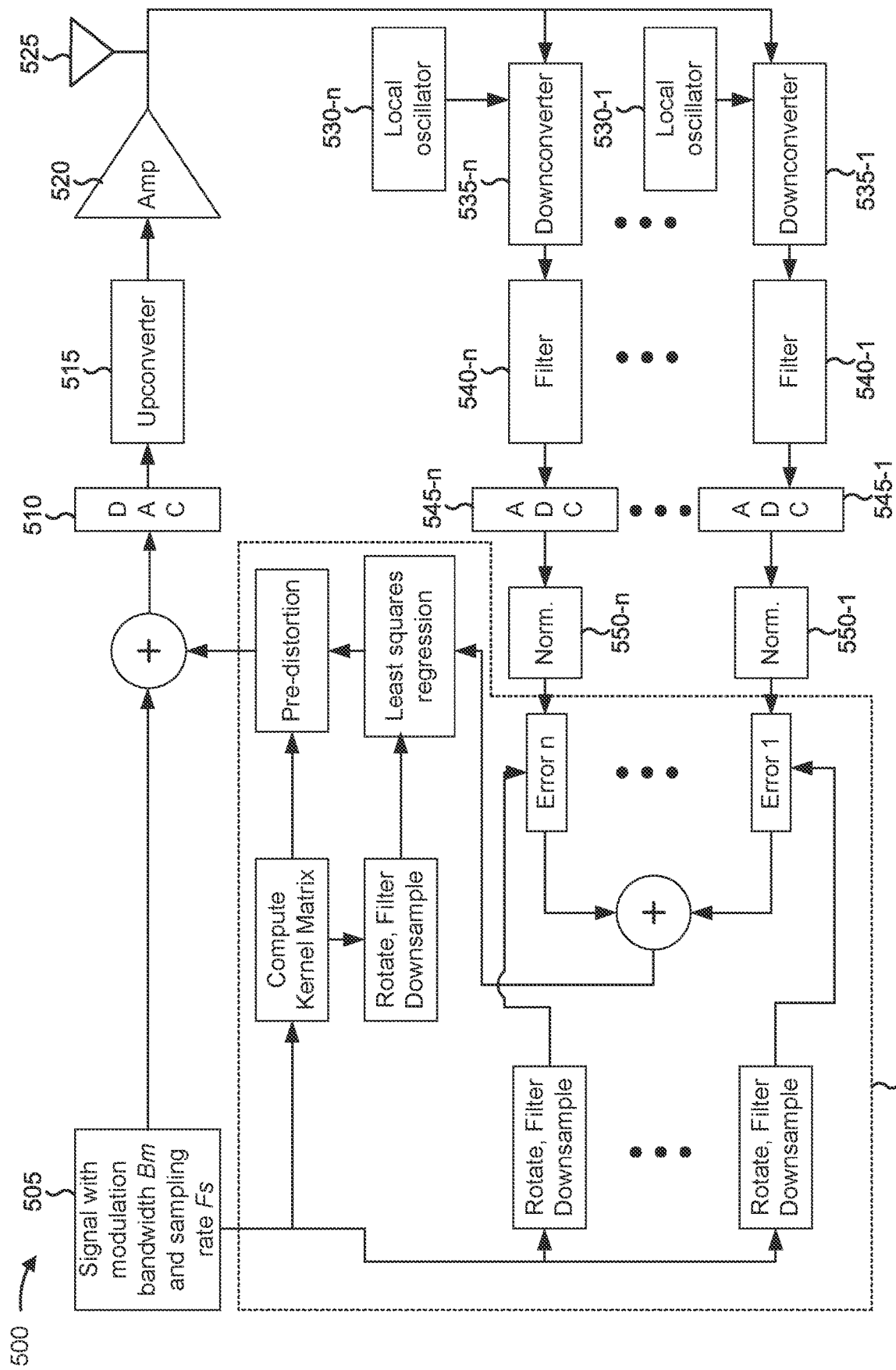
FIG. 5 is a diagram illustrating another example architecture for optimizing fractional bandwidth DPD in a time domain, in accordance with the present disclosure.

FIG. 5 is a diagram illustrating an example architecture 500 for optimizing 5G fractional bandwidth DPD in a time domain, in accordance with the present disclosure. Example 500 may be included in a transceiver chain of a UE (e.g., UE 120) and/or a transceiver chain of a base station (e.g., base station 110).

As shown in FIG. 5, a signal 505 may be modulated using a modulation bandwidth (e.g., represented by Bm) and may have an associated sampling rate (e.g., represented by Fs). For example, the modulation bandwidth Bm may be 2 GHz or higher for mmW communications in 5G. In some aspects, due to leakage into neighboring bands, the signal 505 may be transmitted in a total bandwidth (e.g., represented by Bd) that includes distortions in the neighboring bands. The total bandwidth may be greater than or equal to the modulation bandwidth (e.g., Bd≥Bm). For example, the total bandwidth Bd may be 10 GHz or higher for mmW communications in 5G. Similarly, the total bandwidth may be associated with a sampling rate (e.g., represented by Ds) that is larger than the associated sampling rate (e.g., Ds≥Fs).

The signal 505 may pass through a DAC 510 and be upconverted to RF by an upconverter 515 before being amplified at a power amplifier 520. The power amplifier 520 may amplify an analog signal that is output from the upconverter 515 and is based at least in part on an analog signal output by the DAC 510 and corresponding to the signal 505. Accordingly, an antenna 525 may generate a transmit signal OTA based at least in part on the amplified analog signal from the power amplifier 520.

However, the power amplifier 520 may have non-linearities that introduce distortion into the transmit signal. The distortion may be included in portions of the amplified analog signal corresponding to the modulation bandwidth Bm and/or may include leakages into neighboring bands that are within the total bandwidth Bd. In order to compensate for these non-linearities, a first local oscillator 530-1 (of n local oscillators) may tune a first downconverter 535-1 (of n downconverters) to receive the transmit signal corresponding to the signal 505. The local oscillator 530-1 may be included in a direct conversion receiver or an IF receiver. Although depicted separately from the downconverter 535-1, in some aspects, the local oscillator 530-1 may be at least partially integrated with the downconverter 535-1. In some aspects, the local oscillator 530-1 may be configured to cover a first fraction (e.g., represented by 1/N) of the total bandwidth Bd, such as a 400 MHz fraction of a 3600 MHz total bandwidth. For example, a controller associated with the local oscillator 530-1 may instruct the local oscillator to generate a tuning signal in order to tune the downconverter 535-1 to a central frequency within the first fraction and cover a range above and below the central frequency such that the range comprises the first fraction of the total bandwidth Bd. As a result, the local oscillator 530-1 may conserve power as compared with being configured to cover the total bandwidth Bd.

As further shown in FIG. 5, the downconverter 535-1 may provide input to a first ADC 545-1 (of n ADCs), where the input is based at least in part on the received transmit signal (corresponding to the signal 505). In some aspects, the input is further filtered by a first filter 540-1 (of n filters) before being provided to the ADC 545-1. The ADC 545-1 (and optionally the filter 540-1) may sample at the first fraction of the total bandwidth and output a first digital signal based at least in part on the input. For example, the ADC 545-1 (and optionally the downconverter 535-1 and/or the filter 540-1) may be configured to operate at a sampling rate corresponding to the first fraction (e.g., at a clock rate proportional to Ds/N, where Ds is the sampling rate corresponding to the total bandwidth). As a result, the ADC 545-1 (and optionally the downconverter 535-1 and/or the filter 540-1) may conserve power as compared with operating at a sampling rate corresponding to the total bandwidth Bd.

Accordingly, a processor 555 may determine an error (e.g., "Error 1" in FIG. 5) associated with the signal 505 based at least in part on the first digital signal output by the ADC 545-1. In some aspects, the first digital signal is further normalized by a normalizer 550-1 (of n normalizers) before being provided to the processor 555.

As shown in FIG. 5, the processor 555 may determine the error based at least in part on a band error computed in a time domain. Accordingly, the processor 555 may refrain from applying an FFT and/or another transform from a time domain into the frequency domain to the first digital signal output by the ADC 545-1 and to the signal 505. In some aspects, the signal 505 may be rotated, filtered, and/or down-sampled. For example, the processor 555 may rotate, filter, and/or down-sample the signal 505 based at least in part on the first fraction.

Accordingly, the processor 555 may determine the error (e.g., "Error 1" in FIG. 5), in the time domain, based at least in part on the signal 505 and the first digital signal output by the ADC 545-1. In example 400, n−1 additional local oscillators may be configured (e.g., by the controller) to cover additional fractions of the total bandwidth. For example, the additional local oscillators may generate additional tuning signals in order to tune the additional downconverters to cover different ranges that comprise the additional fractions of the total bandwidth Bd. Accordingly, n−1 additional ADCs may output additional digital signals based at least in part on sampling at the additional fractions of the total bandwidth. Further, the processor 555 may determine additional errors (e.g., up to "Error n" in FIG. 5) based at least in part on the additional digital signals output by the additional ADCs. Thus, the processor 555 may sum the errors (e.g., shown using a "+" in FIG. 5) based at least in part on the digital signals output by ADCs 545-1 to 545-$n$ using input from downconverters 535-1 to 535-$n$.

In some aspects, the local oscillators 530-1 to 530-$n$ may be configured such that the total bandwidth is covered. Accordingly, the processor 555 may determine the error based at least in part on outputs from the ADCs 545-1 to 545-$n$ that represent the total bandwidth. As an alternative, the local oscillators 530-1 to 530-$n$ may be configured such that a portion of the total bandwidth is covered. For example, the local oscillators 530-1 to 530-$n$ may be configured to cover a first fraction of the total bandwidth (e.g., frequencies from −600 MHz to −200 MHz of a reference frequency) and a second fraction of the total bandwidth (e.g., frequencies from +200 MHz to +600 MHz of the reference frequency) but not a third fraction of the total bandwidth (e.g., frequencies from −200 MHz to +200 MHz of the reference frequency). Accordingly, the processor 555 may determine the error based at least in part on outputs from the ADCs 545-1 to 545-$n$ that represent a subset of the total bandwidth. As a result, the processor 555 may conserve power and reduce convergence time when running a least squares regression (e.g., as described below) as compared with using outputs from the ADCs 545-1 to 545-$n$ that represent the total bandwidth.

In some aspects, the subset of the total bandwidth covered by the local oscillators 530-1 to 530-$n$ and the ADCs 545-1 to 545-$n$ may vary. Additionally, or alternatively, the subset of the total bandwidth, covered by the local oscillators 430-1 to 430-$n$ and the ADCs 445-1 to 445-$n$, may include a pattern of fractions of the total bandwidth.

In some aspects, a transceiver chain may use outputs that represent a subset of the total bandwidth even when using a local oscillator that covers the total bandwidth and/or an ADC configured to sample at a rate corresponding to the total bandwidth. Accordingly, a processor of that transceiver chain may still conserve power and reduce convergence time even when the local oscillator and/or the ADC consume additional power to cover the total bandwidth.

The processor 555 may further determine a digital pre-distortion to apply to new signals, before input to the DAC 510, using a least squares regression. For example, the least squares regression may use a kernel matrix based at least in part on the signal 505 and the determined error between the signal 505 and the amplified analog signal received by the downconverters 535-1 to 535-$n$. In some aspects, the kernel matrix may be rotated, filtered, and/or down-sampled before undergoing FFT for use in the least squares regression. For example, the processor 555 may rotate, filter, and/or down-sample the kernel matrix based at least in part on the subset of the total bandwidth represented by outputs from the ADCs 545-1 to 545-$n$.

In some aspects, the processor 555 may perform the least squares regression at a sub-rate corresponding to the first fraction of the total bandwidth. For example, the processor 555 may operate at a sampling rate corresponding to the first fraction (e.g., at a clock rate proportional to Ds/N, where Ds is the sampling rate corresponding to the total bandwidth).

As a result, the processor 555 may conserve power as compared with operating at a sampling rate corresponding to the total bandwidth Bd.

In some aspects, a transceiver chain may perform least squares regressions at a sub-rate even when using a local oscillator that covers the total bandwidth and/or an ADC configured to sample at a rate corresponding to the total bandwidth. Accordingly, a processor of that transceiver chain may still conserve power even when the local oscillator and/or the ADC consume additional power to cover the total bandwidth.

The digital pre-distortion applied to new signals may reduce noise within the modulation bandwidth Bm caused by non-linearity of the amplifier 520 when the digital pre-distortion is applied at a rate equal to the modulation bandwidth. For example, the processor 555 may apply the digital pre-distortion to portions of the new signals corresponding to the modulation bandwidth Bm in analog. In some aspects, the digital pre-distortion applied to new signals may further reduce leakage outside the modulation bandwidth Bm but within the total bandwidth Bd caused by non-linearity of the amplifier 520 when the digital pre-distortion is applied at a rate greater than the modulation bandwidth. For example, the processor 555 may apply the digital pre-distortion to portions of the new signals corresponding to at least part of the total bandwidth Bd, that is larger than the modulation bandwidth Bm, in analog.

By using techniques as described in connection with FIG. 5, the local oscillators 530-1 to 530-$n$ and the ADCs 545-1 to 545-$n$ may operate according to lower bandwidths. As a result, the local oscillators 530-1 to 530-$n$ and the ADCs 545-1 to 545-$n$ conserve power, and digital pre-distortion can still be applied with high levels of accuracy to reduce noise and/or leakage. Additionally, or alternatively, the processor 555 may operate at a sub-rate proportional to lower bandwidths. As a result, the processor 555 conserves power, and digital pre-distortion can still be applied with high levels of accuracy to reduce noise and/or leakage. Additionally, or alternatively, the processor 555 may perform the least squares regression using a subset of a total bandwidth. As a result, the processor 555 conserves power and operates faster. Additionally, any decreases in accuracy for the digital pre-distortion are usually not significant.

As indicated above, FIG. 5 is provided as an example. Other examples may differ from what is described with respect to FIG. 5.

Resource utilization efficiency, such as radiated power, may be a significant factor in a design of a wireless system. A transmitter device may include one or more non-linear components, such as a high-power power amplifier (PA) having a limited linear dynamic range. This may result in a signal transmitted by the transmitter device becoming distorted, for example, due to a high peak-to-average power ratio (PAPR). To avoid these distortions, the transmitter device may perform a power back-off (BO). However, power efficiency may be reduced when power BO is increased. An alternative approach to power BO is to use digital pre-distortion (DPD) at a front-end of the transmitter device. Using DPD, the amount of distortion is maintained below a target level while the power BO is reduced and, therefore, PA efficiency is improved. In frequency range 2 (FR2), such as for downlink communications in FR2 where a single DPD engine controls a large array of elements (e.g., greater than or equal to 64 elements), in order to achieve a high-level of performance, a non-linear model may need to be estimated in accordance with end-to-end (E2E) link and/or far-field training. For example, the non-linear model may be estimated using a "typical" element that is representative of the array of elements. This may be satisfactory for uplink communications, where the array of elements is generally small and a single RF model is used. However, for an estimation of the non-linear model for downlink communications where larger arrays of elements are used, and where the DPD is beam-dependent and sensitive to temperature variations, this may lead to inaccurate estimation results. In some cases, DPD with far-field training may be able to achieve an optimal PA efficiency for a large array of transmitters that are controlled (e.g., "pushed") by a single DPD engine. In the case of multi-user (MU) frequency division multiplexing (FDM), feedback may not be able to be delivered by a single receiver device since the receiver device may not receive the entire transmitted signal and/or may receive the signal via a degraded channel. Therefore, DPD with far-field training may not be optimized for transmissions by the transmitter device to a plurality of receiver devices. In particular, DPD with far-field training may not be optimized for multiple receiver device FDM communications.

Figure 6:
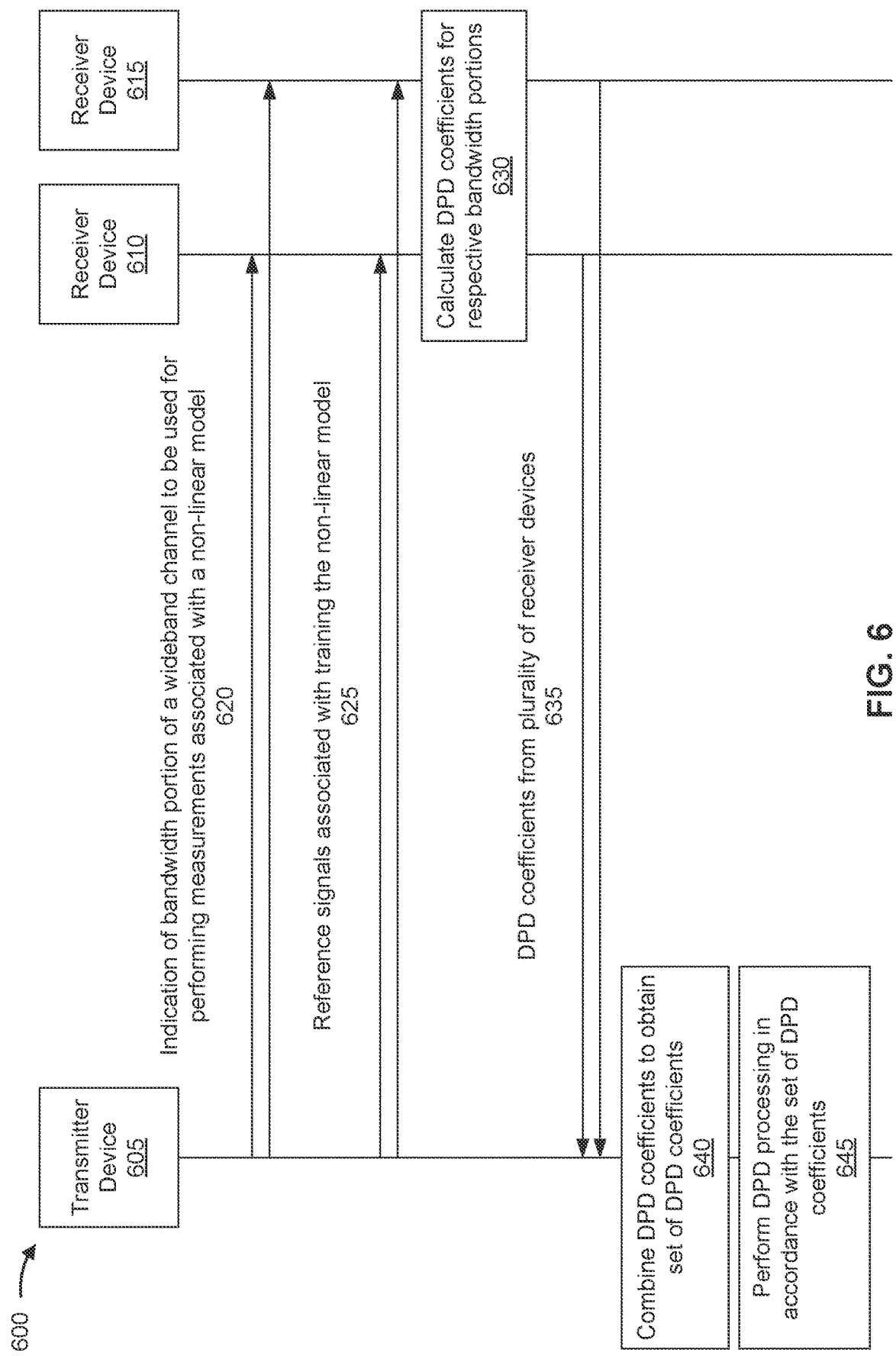
FIG. 6 is a diagram illustrating an example of DPD signaling, in accordance with the present disclosure.

FIG. 6 is a diagram illustrating an example 600 of digital pre-distortion signaling, in accordance with the present disclosure. A transmitter device 605 may communicate with one or more receiver devices, such as the receiver device 610 and the receiver device 615. As described in more detail below, the transmitter device 605, the receiver device 610, and/or the receiver device 615 may be, or may include, any type of network entity, such as the network node 110 or the UE 120. The transmitter device may communicate with the receiver device 610 and the receiver device 615 over a wideband channel and using FDM. While the example 600 shows a single transmitter device and two receiver devices, any number of devices may be used.

As shown by reference number 620, the transmitter device 605 may transmit, and the receiver device 610 and the receiver device 615 may receive, an indication of a bandwidth portion (e.g., a bandwidth chunk) of the wideband channel to be used for performing measurements associated with a non-linear model of the transmitter device. Additionally, or alternatively, the transmitter device 605 may transmit configuration information to the receiver device 610 and the receiver device 615, as described in more detail below.

The transmitter device 605 may determine which receiver devices, of a plurality of receiver devices, are to assist the transmitter device 605 in training the non-linear model. For example, the transmitter device 605 may select the receiver device 610 and the receiver device 615 for assisting the transmitter device 605 in training the non-linear model. The transmitter device 605 may not need to fill the entire spectrum of the wideband channel. In some aspects, the transmitter device 605 may opportunistically train the non-linear model using arbitrary receiver devices for target transmissions on different frequency chunks, and may update wideband DPD coefficients each time a result is reported by a receiver device. The updating may be performed in parallel (in accordance with FDM feedback) or may be performed in serial (using time division multiplexing (TDM)) with a single receiver device that is reconfigured to different bandwidth portions for multiple repetitions.

The transmitter device 605 may configure each of the selected receiver devices with relevant parameters. For example, the transmitter device 605 may configure the receiver device 610 and the receiver device 615 with one or more parameters for training the non-linear model. In some aspects, the one or more parameters may include a parameter that indicates a type of training (e.g., direct training or indirect training) to be used for training the non-linear model. In some aspects, the one or more parameters may include a parameter that indicates a kernel list for which the DPD coefficients are required. The kernel list may include an index of predefined kernels (e.g., in accordance with the 3GPP specifications) and/or may include one or more other kernels such as $x[n-\alpha]^{\gamma} \cdot x^*[n-\beta]^{\lambda}$, where $\gamma$ and $\lambda$ are integers, and $\beta$ and $\alpha$ are in units of the baseband (BB) samples of the wideband signal. Alternatively, the one or more other kernels may be fractional, such as $2^k$ of the BB sample time of the wideband reference signal, where k is an integer (e.g., a positive or negative integer). In some aspects, the one or more parameters may include a parameter of the wideband reference signal that is used for training the non-linear model, such as total bandwidth, an index of the reference signal, and/or a power indicator, among other examples. In some aspects, the one or more parameters may include a UE-specific parameter, such as which resource blocks are relevant for each UE. In some aspects, the one or more parameters may include a root-mean-square (RMS) of a "trivial" (e.g., $\alpha=\beta=\lambda=0$, $\gamma=1$) kernel.

The transmitter device 605 may transmit, to the receiver device 610 and the receiver device 615, transmission information associated with each of the receiver devices that are taking part in the training at the same time. The transmitter device 605 may transmit the transmission information while the receiver devices are performing the measurements, which, as described above, may be sparse. In some aspects, the transmission information may include resource blocks (and/or other units of frequency bandwidth allocation) on which the reference signals are to be allocated. Additionally, or alternatively, the transmission information may include digital precoding information of the reference signal, such as digital precoding information that is likely to be matched to the digital precoding of a physical downlink shared channel (PDSCH). In some aspects, the transmission information may be related to the wideband reference signal.

In some aspects, the transmitter device 605 may indicate that the reference signal is a demodulation reference signal (DMRS) (or other pilot signal such as a channel state information (CSI) reference signal (RS), a transmission reference signal (TRS), or a sounding reference signal (SRS), among other examples). The indication that the reference signal is the DMRS (or the other pilot signal) may include one or more of the parameters described above. In some aspects, the analog beam may be the same as in a regular PDSCH or physical uplink shared channel (PUSCH) transmission. However, if the analog beam is not the same as in the regular PDSCH or PUSCH, the transmitter device 605 may not signal this information to the receiver device 610 or the receiver device 615. Additionally, since the receiver devices may be served with different transmission beams, FDM may be challenging, and thus, TDM may be applied and the bandwidth portion may be switched each time (e.g., each repetition) to cover the entire wideband. Each of the TDM repetitions may be for different receiver devices. In an example where a specific receiver device (such as the receiver device 610 or the receiver device 615) is configured with multiple component carriers, the reference signal may be wide and may cover all of the component carriers for all of the receiver devices. In an example where the digital precoding used for measuring the reference signal does not match the digital precoding that is used for the PDSCH or the PUSCH, the devices may follow one or more rules (such as physical resource grid (PRG) boundary rules described in the 3GPP specification) as those used for the PDSCH or PUSCH.

As shown by reference number 625, the transmitter device 605 may transmit, and the receiver device 610 and the receiver device 615 may receive, one or more wideband reference signals associated with training the non-linear model. In some aspects, the transmitter device 605 may transmit the same wideband reference signal (or wideband reference signals) to the plurality of receiver devices, such as the receiver device 610 and the receiver device 615.

As shown by reference number 630, the receiver device 610 and the receiver device 615 may calculate DPD coefficients for the respective bandwidth portions. For example, the receiver device 610 may receive the wideband reference signal(s) and may calculate a DPD coefficient within the bandwidth portion allocated to the receiver device 610. Additionally, the receiver device 615 may receive the wideband reference signal(s) and may calculate a DPD coefficient within the bandwidth portion allocated to the receiver device 615.

In some aspects, the receiver device 610 may receive the reference signal(s) on a first bandwidth portion allocated to the receiver device 610, including analog or digital filtering (in accordance with the receiver device 610 configuration). The receiver device 610 may estimate the linear channel and perform equalization within the first bandwidth portion. The receiver device 610 may estimate the non-linear coefficients in accordance with the configured kernels and the estimation type (e.g., direct or indirect) for the receiver device 610. The receiver device 610 may determine a quality of the estimation by the receiver device 610. Additionally, the receiver device 615 may receive the reference signal(s) on a second bandwidth portion allocated to the receiver device 615, including analog or digital filtering (in accordance with the receiver device 615 configuration). The receiver device 615 may estimate the linear channel and perform equalization within the second bandwidth portion. The receiver device 615 may estimate the non-linear coefficients in accordance with the configured kernels and the estimation type (e.g., direct or indirect) for the receiver device 615. The receiver device 615 may determine a quality of the estimation by the receiver device 615.

As shown by reference number 635, the receiver device 610 and the receiver device 615 may transmit, and the transmitter device 605 may receive, the DPD coefficients. For example, each receiver device may report the estimated DPD coefficients (and, in some cases, a quality of the estimation) to the transmitter device 605. In some aspects, the transmitter device 605 may be a network node, the receiver device 610 may be a first UE that is connected to the network node, and the receiver device 615 may be a second UE that is connected to the network node. In this case, the receiver device 610 and the receiver device 615 may report the DPD coefficients directly to the transmitter device 605. In some other aspects, the transmitter device 605 may be a first UE, the receiver device 610 may be a second UE, and the receiver device 615 may be a third UE. In a first example (e.g., Mode 1 sidelink), the receiver device 605 and the receiver device 610 may report the DPD coefficients to a network node, and the network node may report the DPD coefficients to the transmitter device 605. In a second example (e.g., Mode 2 sidelink), the receiver device 605 and the receiver device 610 may report the DPD coefficients directly to the transmitter device 605.

As shown by reference number 640, the transmitter device 605 may combine the DPD coefficients to obtain a set of DPD coefficients (e.g., a combined set of DPD coefficients or a set of combined DPD coefficients). For example, the transmitter device 605 may receive a first DPD coefficient from the receiver device 610 (in accordance with the bandwidth portion allocated to the receiver device 610) and a second DPD coefficient from the receiver device 615 (in accordance with the bandwidth portion allocated to the receiver device 615), and may generate a set of DPD coefficients that is based at least in part on the first DPD coefficient and the second DPD coefficient.

In some aspects, the transmitter device 605 may manage a pool of coefficients for a narrowband bandwidth portion (which may correlate with the bandwidth portion allocations to the receiver device 610 and the receiver device 615). In some aspects, the narrowband bandwidth portion may be for a component carrier, for a set of resource blocks, or another bandwidth unit, among other examples. Each time the transmitter device 605 receives a new set of coefficients from the receiver device 610 and/or the receiver device 615, the transmitter device 605 may replace the coefficients stored at the transmitter device 605. The replacement may be performed using a filter, such as an infinite impulse response (IIR) filter, or using any type of averaging or filtering, among other examples. In some aspects, the transmitter device 605 may associate a time stamp with a validity of a specific bandwidth portion. If a time period associated with the time stamp expires, the bandwidth portion may not be used again until a new set of coefficients are received from a receiver device. In some aspects, the transmitter device 605 may average all of the narrowband DPD coefficients that are in a pool of coefficients to generate a wideband set of DPD coefficients. The transmitter device 605 may use the set of wideband DPD coefficients for a wideband DPD configuration.

As shown by reference number 645, the transmitter device 605 may perform DPD processing in accordance with the set of DPD coefficients. For example, the transmitter device 605 may perform DPD processing and may train the non-linear model for future communications with FDM receivers in a far-field.

As indicated above, FIG. 6 is provided as an example. Other examples may differ from what is described with respect to FIG. 6.

Figure 7:
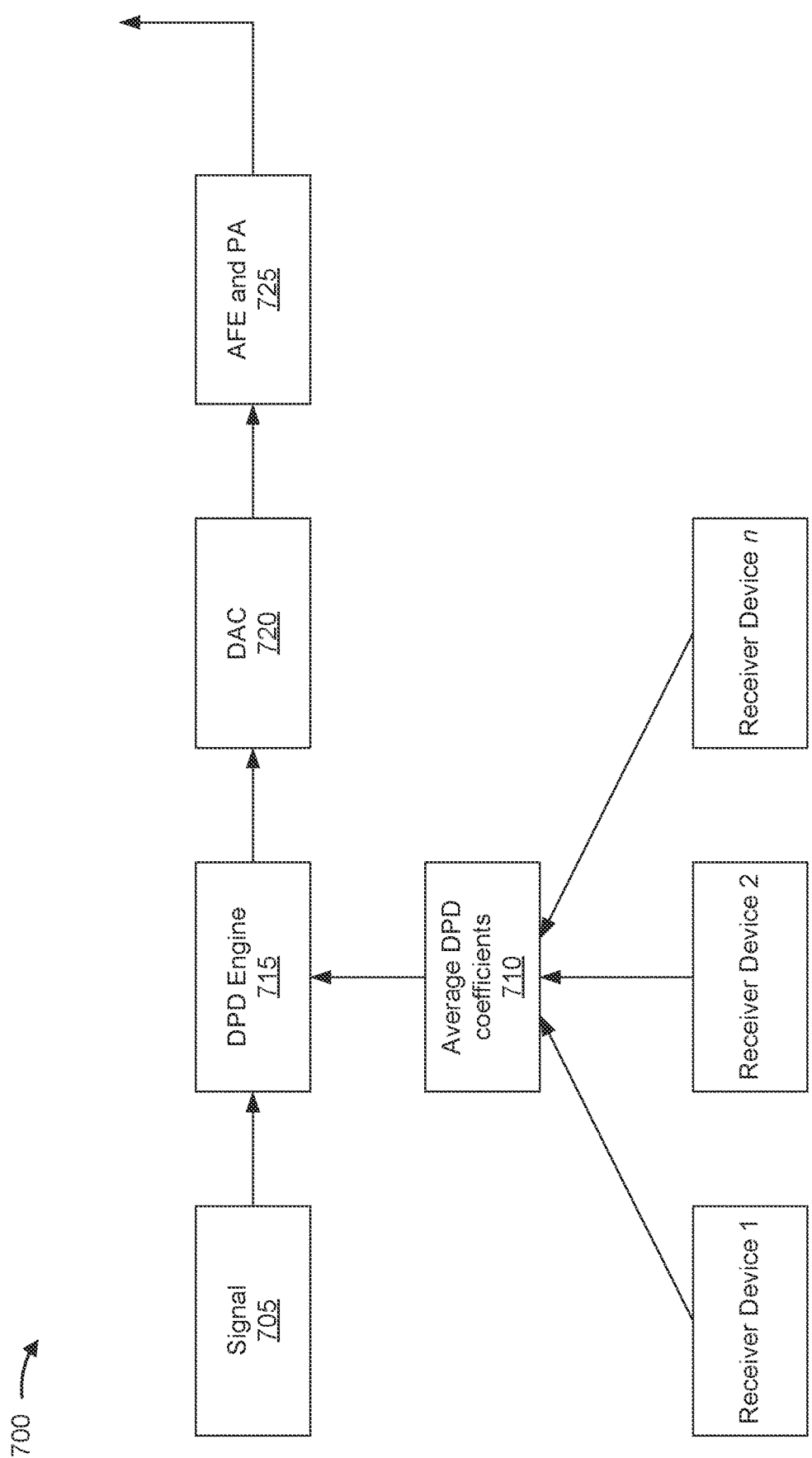
FIG. 7 is a diagram illustrating an example of transmitter device DPD processing, in accordance with the present disclosure.

FIG. 7 is a diagram illustrating an example 700 of transmitter device DPD processing, in accordance with the present disclosure. The transmitter device may be, or may include, the transmitter device 605 described in connection with FIG. 6. The transmitter device may communicate with a plurality of receiver devices, such as receiver device 1, receiver device 2, and receiver device n. As shown by reference number 705, the transmitter device may obtain (e.g., generate) a signal. The signal may have a bandwidth (B) and a frequency (F) that is based at least in part on a DAC rate of the transmitter device. The transmitter device may receive a plurality of DPD coefficients from the plurality of receiver devices. For example, as described above in connection with reference number 635, the transmitter device may receive a first DPD coefficient from receiver device 1 that is based at least in part on a bandwidth portion allocated to the receiver device 1, a second DPD coefficient from receiver device 2 that is based at least in part on a bandwidth portion allocated to the receiver device 2, and an nth DPD coefficient from receiver device n that is based at least in part on a bandwidth portion allocated to the receiver device n. As shown by reference number 710, the transmitter device may average the plurality of DPD coefficients received from the plurality of receiver devices. For example, as described above in connection with reference number 640, the transmitter device may combine the plurality of DPD coefficients to generate a set of DPD coefficients. A DPD engine 715 of the transmitter device may combine the signal with the average of the DPD coefficients to generate a first output. A DAC 720 of the transmitter device may perform digital-to-analog conversion for the first output to generate a second output. An analog front end (AFE) and power amplifier (PA) 725 may process the second output, for example, by performing AFE and PA processing, and may generate a third output. The third output may be used to train the non-linear model of the transmitter device and/or may be used for future communications with the receiver device 1, receiver device 2, and receiver device n.

As indicated above, FIG. 7 is provided as an example. Other examples may differ from what is described with respect to FIG. 7.

Figure 8:
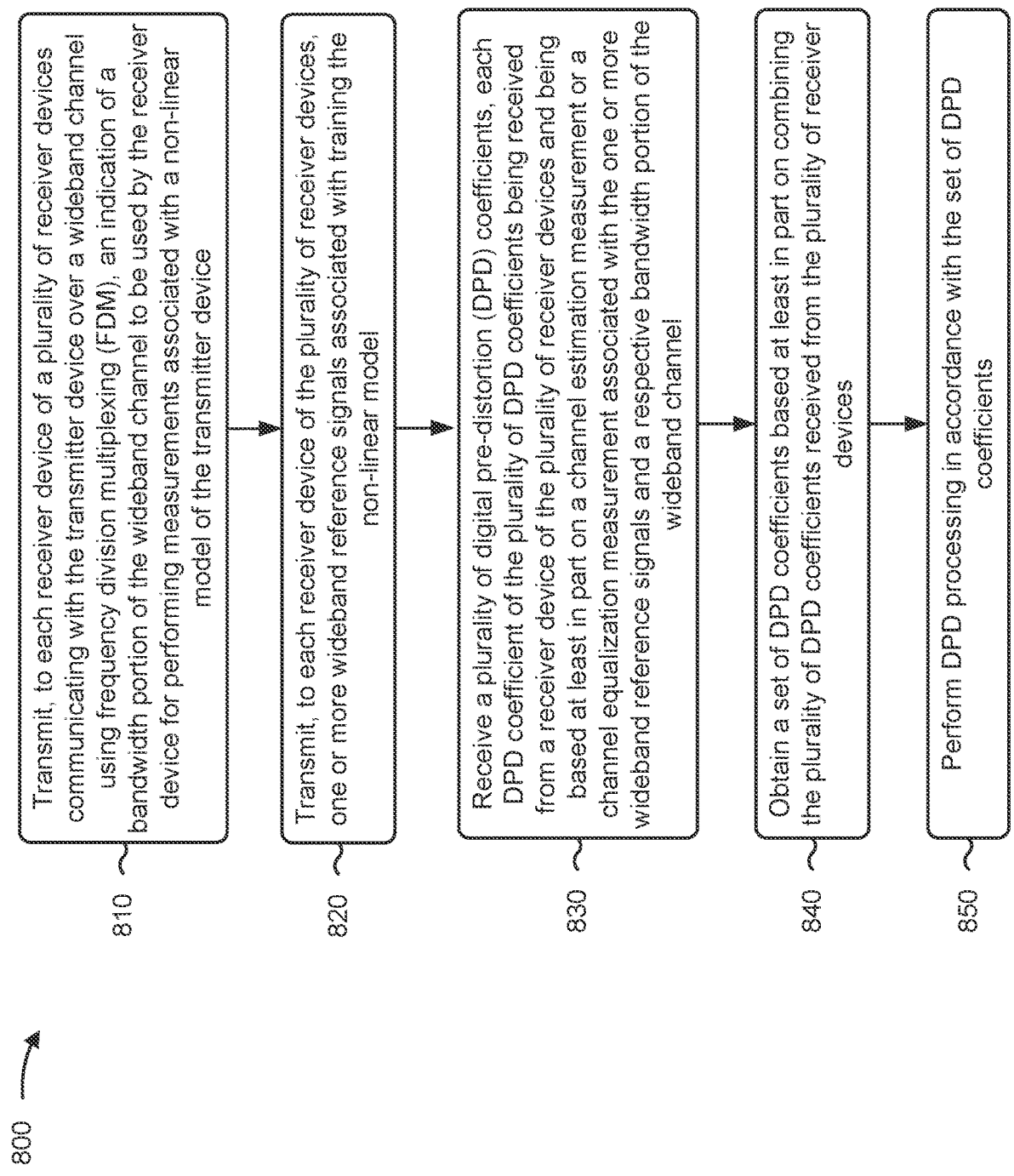
FIG. 8 is a diagram illustrating an example process performed, for example, by a transmitter device, in accordance with the present disclosure.

FIG. 8 is a diagram illustrating an example process 800 performed, for example, by a transmitter device, in accordance with the present disclosure. Example process 800 is an example where the transmitter device (e.g., transmitter device 605) performs operations associated with digital pre-distortion signaling. In some aspects, the transmitter device may be a UE, such as the UE 120. In some other aspects, the transmitter device may be a network node, such as the network node 110.

As shown in FIG. 8, in some aspects, process 800 may include transmitting, to each receiver device of a plurality of receiver devices communicating with the transmitter device over a wideband channel using FDM, an indication of a bandwidth portion of the wideband channel to be used by the receiver device for performing measurements associated with a non-linear model of the transmitter device (block 810). For example, the transmitter device (e.g., using transmission component 1004 and/or communication manager 1006, depicted in FIG. 10, or using transmission component 1104 and/or communication manager 1106, depicted in FIG. 11) may transmit, to each receiver device of a plurality of receiver devices communicating with the transmitter device over a wideband channel using FDM, an indication of a bandwidth portion of the wideband channel to be used by the receiver device for performing measurements associated with a non-linear model of the transmitter device, as described above.

As further shown in FIG. 8, in some aspects, process 800 may include transmitting, to each receiver device of the plurality of receiver devices, one or more wideband reference signals associated with training the non-linear model (block 820). For example, the transmitter device (e.g., using transmission component 1004 and/or communication manager 1006, depicted in FIG. 10, or using transmission component 1104 and/or communication manager 1106, depicted in FIG. 11) may transmit, to each receiver device of the plurality of receiver devices, one or more wideband reference signals associated with training the non-linear model, as described above.

As further shown in FIG. 8, in some aspects, process 800 may include receiving a plurality of DPD coefficients, each DPD coefficient of the plurality of DPD coefficients being received from a receiver device of the plurality of receiver devices and being based at least in part on a channel estimation measurement or a channel equalization measurement associated with the one or more wideband reference signals and a respective bandwidth portion of the wideband channel (block 830). For example, the transmitter device (e.g., using reception component 1002 and/or communication manager 1006, depicted in FIG. 10, or using reception component 1102 and/or communication manager 1106, depicted in FIG. 11) may receive a plurality of DPD coefficients, each DPD coefficient of the plurality of DPD coefficients being received from a receiver device of the plurality of receiver devices and being based at least in part on a channel estimation measurement or a channel equalization measurement associated with the one or more wideband reference signals and a respective bandwidth portion of the wideband channel, as described above.

As further shown in FIG. 8, in some aspects, process 800 may include obtaining a set of DPD coefficients based at least in part on combining the plurality of DPD coefficients received from the plurality of receiver devices (block 840). For example, the transmitter device (e.g., using communication manager 1006, depicted in FIG. 10, or using communication manager 1106, depicted in FIG. 11) may obtain a set of DPD coefficients based at least in part on combining the plurality of DPD coefficients received from the plurality of receiver devices, as described above.

As further shown in FIG. 8, in some aspects, process 800 may include performing DPD processing in accordance with the set of DPD coefficients (block 850). For example, the transmitter device (e.g., using communication manager 1006, depicted in FIG. 10, or using communication manager 1106, depicted in FIG. 11) may perform DPD processing in accordance with the set of DPD coefficients, as described above.

Process 800 may include additional aspects, such as any single aspect or any combination of aspects described below and/or in connection with one or more other processes described elsewhere herein.

In a first aspect, process 800 includes selecting the plurality of receiver devices from a set of receiver devices based at least in part on one or more characteristics of the wideband channel or the non-linear model, and transmitting, to the plurality of receiver devices, configuration information indicating one or more parameters for performing measurements associated with the one or more wideband reference signals.

In a second aspect, alone or in combination with the first aspect, a total bandwidth portion allocated to the plurality of receiver devices for performing the measurements associated with the non-linear model is less than a total bandwidth portion of the wideband channel.

In a third aspect, alone or in combination with one or more of the first and second aspects, process 800 includes updating a plurality of DPD coefficients in accordance with receiving the plurality of DPD coefficients from the plurality of receiver devices.

In a fourth aspect, alone or in combination with one or more of the first through third aspects, the one or more parameters for performing the measurements include at least one of a type of non-linear model training associated with the non-linear model, a kernel list that indicates one or more kernels for which the plurality of DPD coefficients are required, a wideband reference signal parameter that indicates the one or more wideband reference signals to be used for training the non-linear model, a receiver-device-specific parameter that indicates a resource block to be used by a receiver device of the plurality of receiver devices, or an indication of a root mean square associated with a first linear kernel.

In a fifth aspect, alone or in combination with one or more of the first through fourth aspects, process 800 includes transmitting, to each receiver device of a set of receiver devices associated with training the non-linear model, an indication of transmission information associated with transmitting the plurality of DPD coefficients, wherein the transmission information includes at least a first subset of transmission information to be used by a first receiver device of the plurality of receiver devices for performing measurements and a second subset of transmission information to be used by a second receiver device of the plurality of receiver devices for performing measurements.

In a sixth aspect, alone or in combination with one or more of the first through fifth aspects, transmitting the indication of the transmission information comprises transmitting, to each receiver device of the set of receiver devices, the indication of the transmission information by the set of receiver devices while the set of receiver devices are training the non-linear model.

In a seventh aspect, alone or in combination with one or more of the first through sixth aspects, the indication of the transmission information includes at least one of an indication of one or more resource blocks on which the one or more wideband reference signals are to be allocated, an indication of a digital precoding associated with the one or more wideband reference signals, or information associated with the one or more wideband reference signals.

In an eighth aspect, alone or in combination with one or more of the first through seventh aspects, receiving the plurality of DPD coefficients comprises receiving an estimation of each DPD coefficient of the plurality of DPD coefficients and an indication of a quality of the estimation of each DPD coefficient of the plurality of DPD coefficients.

In a ninth aspect, alone or in combination with one or more of the first through eighth aspects, the transmitter device is a network node and the plurality of receiver devices are a plurality of UEs, and receiving the plurality of DPD coefficients comprises directly receiving a DPD coefficient from each UE of the plurality of UEs.

In a tenth aspect, alone or in combination with one or more of the first through ninth aspects, the transmitter device is a first UE and the plurality of receiver devices includes at least a second UE and a third UE, and receiving the plurality of DPD coefficients comprises receiving, via a network node, a first DPD coefficient associated with the second UE and a second DPD coefficient associated with the third UE.

In an eleventh aspect, alone or in combination with one or more of the first through tenth aspects, the transmitter device is a first UE and the plurality of receiver devices includes at least a second UE and a third UE, and receiving the plurality of DPD coefficients comprises directly receiving a first DPD coefficient from the second UE and a second DPD coefficient from the third UE.

In a twelfth aspect, alone or in combination with one or more of the first through eleventh aspects, process 800 includes managing the plurality of DPD coefficients, wherein the plurality of DPD coefficients are associated with a transmitter beam index, and wherein the plurality of DPD coefficients are associated with a narrowband bandwidth portion for which the set of DPD coefficients are to be reported to the transmitter device.

In a thirteenth aspect, alone or in combination with one or more of the first through twelfth aspects, process 800 includes replacing a first DPD coefficient with a second DPD coefficient, wherein the second DPD coefficient is received after the first DPD coefficient.

In a fourteenth aspect, alone or in combination with one or more of the first through thirteenth aspects, replacing the first DPD coefficient with the second DPD coefficient comprises replacing the first DPD coefficient with the second DPD coefficient in accordance with an infinite impulse response filter or an averaging operation.

In a fifteenth aspect, alone or in combination with one or more of the first through fourteenth aspects, process 800 includes marking the narrowband bandwidth portion with a time stamp, and refraining from using the narrowband bandwidth portion in accordance with an expiration of the time stamp, wherein the averaging operation is performed in accordance with a quality of the first DPD coefficient and the second DPD coefficient.

In a sixteenth aspect, alone or in combination with one or more of the first through fifteenth aspects, obtaining the set of DPD coefficients based at least in part on combining the plurality of DPD coefficients comprises obtaining a wideband set of DPD coefficients based at least in part on averaging the plurality of DPD coefficients received from the plurality of receiver devices, and performing the DPD processing in accordance with the set of DPD coefficients comprises performing the DPD processing in accordance with the wideband set of DPD coefficients.

In a seventeenth aspect, alone or in combination with one or more of the first through sixteenth aspects, performing the DPD processing comprises performing the DPD processing on a signal to be transmitted to one or more receiver devices of the plurality of receiver devices.

Although FIG. 8 shows example blocks of process 800, in some aspects, process 800 may include additional blocks, fewer blocks, different blocks, or differently arranged blocks than those depicted in FIG. 8. Additionally, or alternatively, two or more of the blocks of process 800 may be performed in parallel.

Figure 9:
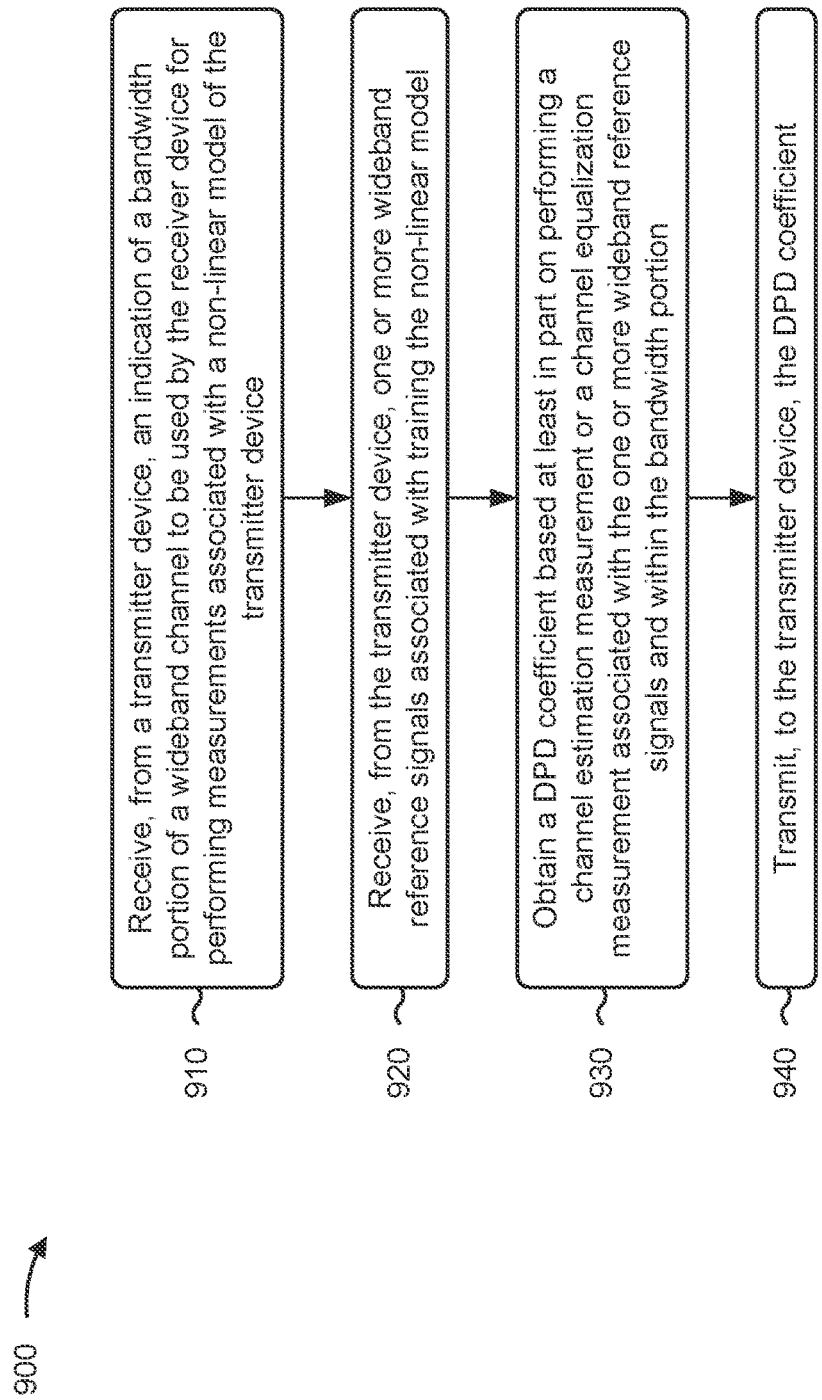
FIG. 9 is a diagram illustrating an example process performed, for example, by a receiver device, in accordance with the present disclosure.

FIG. 9 is a diagram illustrating an example process 900 performed, for example, by a receiver device, in accordance with the present disclosure. Example process 900 is an example where the receiver device (e.g., receiver device 610 or receiver device 615) performs operations associated with digital pre-distortion signaling. In some aspects, the receiver device may be a UE, such as the UE 120. In some other aspects, the receiver device may be a network node, such as the network node 110.

As shown in FIG. 9, in some aspects, process 900 may include receiving, from a transmitter device, an indication of a bandwidth portion of a wideband channel to be used by the receiver device for performing measurements associated with a non-linear model of the transmitter device (block 910). For example, the receiver device (e.g., using reception component 1002 and/or communication manager 1006, depicted in FIG. 10, or using reception component 1102 and/or communication manager 1106, depicted in FIG. 11) may receive, from a transmitter device, an indication of a bandwidth portion of a wideband channel to be used by the receiver device for performing measurements associated with a non-linear model of the transmitter device, as described above.

As further shown in FIG. 9, in some aspects, process 900 may include receiving, from the transmitter device, one or more wideband reference signals associated with training the non-linear model (block 920). For example, the receiver device (e.g., using reception component 1002 and/or communication manager 1006, depicted in FIG. 10, or using reception component 1102 and/or communication manager 1106, depicted in FIG. 11) may receive, from the transmitter device, one or more wideband reference signals associated with training the non-linear model, as described above.

As further shown in FIG. 9, in some aspects, process 900 may include obtaining a DPD coefficient based at least in part on performing a channel estimation measurement or a channel equalization measurement associated with the one or more wideband reference signals and within the bandwidth portion (block 930). For example, the receiver device (e.g., using communication manager 1006, depicted in FIG. 10, or using communication manager 1106, depicted in FIG. 11) may obtain a DPD coefficient based at least in part on performing a channel estimation measurement or a channel equalization measurement associated with the one or more wideband reference signals and within the bandwidth portion, as described above.

As further shown in FIG. 9, in some aspects, process 900 may include transmitting, to the transmitter device, the DPD coefficient (block 940). For example, the receiver device (e.g., using transmission component 1004 and/or communication manager 1006, depicted in FIG. 10, or using transmission component 1104 and/or communication manager 1106, depicted in FIG. 11) may transmit, to the transmitter device, the DPD coefficient, as described above.

Process 900 may include additional aspects, such as any single aspect or any combination of aspects described below and/or in connection with one or more other processes described elsewhere herein.

In a first aspect, process 900 includes receiving, from the transmitter device, one or more parameters for performing measurements associated with the one or more wideband reference signals.

In a second aspect, alone or in combination with the first aspect, the one or more parameters for performing the measurements include at least one of a type of non-linear model training associated with the non-linear model, a kernel list that indicates one or more kernels for which the DPD coefficient is required, a wideband reference signal parameter that indicates the one or more wideband reference signals to be used for training the non-linear model, a receiver-device-specific parameter that indicates a resource block to be used by the receiver device, or an indication of a root mean square associated with a first linear kernel.

In a third aspect, alone or in combination with one or more of the first and second aspects, process 900 includes receiving, from the transmitter device while the receiver device is training the non-linear model, an indication of transmission information associated with transmitting the DPD coefficients, wherein the transmission information is specific to the receiver device.

In a fourth aspect, alone or in combination with one or more of the first through third aspects, the indication of the transmission information includes at least one of an indication of one or more resource blocks on which is the one or more wideband reference signals are to be allocated, an indication of a digital precoding associated with the one or more wideband reference signals, or information associated with the one or more wideband reference signals.

In a fifth aspect, alone or in combination with one or more of the first through fourth aspects, obtaining the DPD coefficient comprises performing the channel estimation measurement and the channel equalization measurement associated with the one or more wideband reference signals, estimating the DPD coefficient in accordance with a kernel list that indicates one or more kernels for which the DPD coefficient is required, and determining a quality of the estimation of the DPD coefficient.

In a sixth aspect, alone or in combination with one or more of the first through fifth aspects, transmitting the DPD coefficient comprises transmitting an estimation of the DPD coefficient and an indication of a quality of the estimation of the DPD coefficient.

In a seventh aspect, alone or in combination with one or more of the first through sixth aspects, the transmitter device is a network node and the receiver device is a UE, and transmitting the DPD coefficient comprises transmitting the DPD coefficient directly to the network node.

In an eighth aspect, alone or in combination with one or more of the first through seventh aspects, the transmitter device is a first UE and the receiver device is a second UE, and transmitting the DPD coefficient comprises transmitting the DPD coefficient to a network node for relaying to the first UE.

In a ninth aspect, alone or in combination with one or more of the first through eighth aspects, the transmitter device is a first UE and the receiver device is a second UE, and transmitting the DPD coefficient comprises transmitting the DPD coefficient directly to the first UE.

Although FIG. 9 shows example blocks of process 900, in some aspects, process 900 may include additional blocks, fewer blocks, different blocks, or differently arranged blocks than those depicted in FIG. 9. Additionally, or alternatively, two or more of the blocks of process 900 may be performed in parallel.

Figure 10:
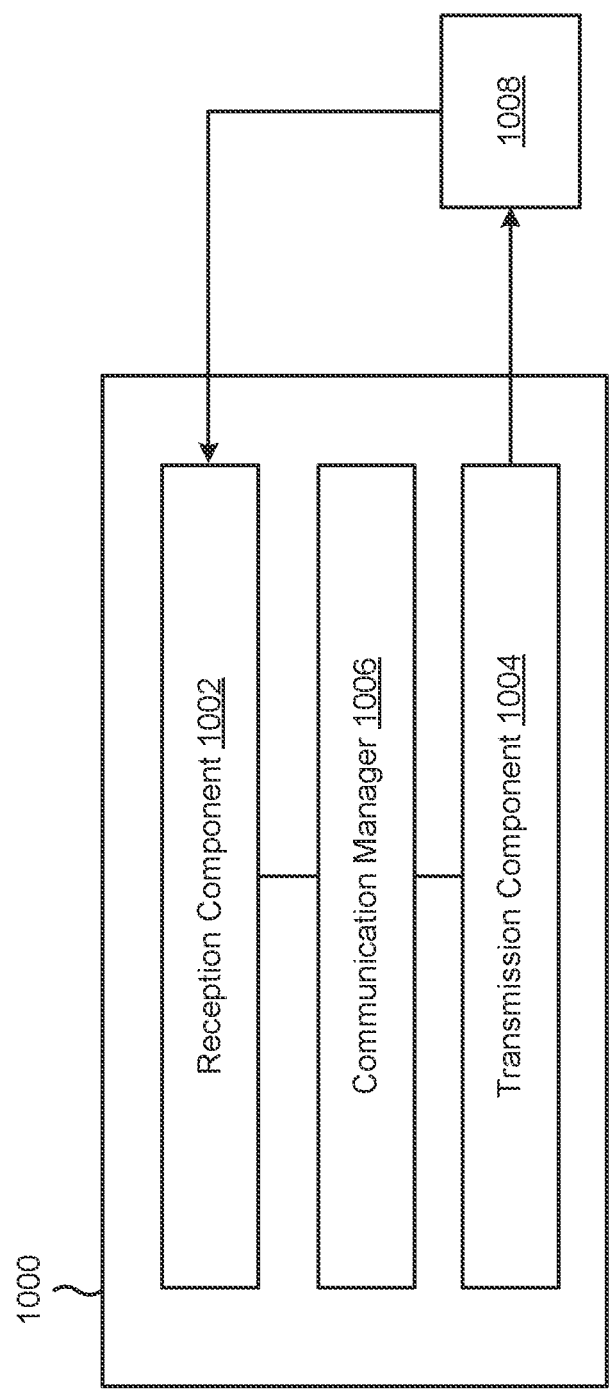
FIG. 10 is a diagram of an example apparatus for wireless communication, in accordance with the present disclosure.

FIG. 10 is a diagram of an example apparatus 1000 for wireless communication, in accordance with the present disclosure. The apparatus 1000 may be a UE, or a UE may include the apparatus 1000. In some aspects, the apparatus 1000 includes a reception component 1002, a transmission component 1004, and/or a communication manager 1006, which may be in communication with one another (for example, via one or more buses and/or one or more other components). In some aspects, the communication manager 1006 is the communication manager 140 described in connection with FIG. 1. As shown, the apparatus 1000 may communicate with another apparatus 1008, such as a UE or a network node (such as a CU, a DU, an RU, or a base station), using the reception component 1002 and the transmission component 1004.

In some aspects, the apparatus 1000 may be configured to perform one or more operations described herein in connection with FIGS. 6-7. Additionally, or alternatively, the apparatus 1000 may be configured to perform one or more processes described herein, such as process 800 of FIG. 8, process 900 of FIG. 9, or a combination thereof. In some aspects, the apparatus 1000 and/or one or more components shown in FIG. 10 may include one or more components of the UE described in connection with FIG. 2. Additionally, or alternatively, one or more components shown in FIG. 10 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1002 may receive communications, such as reference signals, control information, data communications, or a combination thereof, from the apparatus 1008. The reception component 1002 may provide received communications to one or more other components of the apparatus 1000. In some aspects, the reception component 1002 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 1000. In some aspects, the reception component 1002 may include one or more antennas, a modem, a demodulator, a MIMO detector, a receive processor, a controller/processor, a memory, or a combination thereof, of the UE described in connection with FIG. 2.

The transmission component 1004 may transmit communications, such as reference signals, control information, data communications, or a combination thereof, to the apparatus 1008. In some aspects, one or more other components of the apparatus 1000 may generate communications and may provide the generated communications to the transmission component 1004 for transmission to the apparatus 1008. In some aspects, the transmission component 1004 may perform signal processing on the generated communications (such as filtering, amplification, modulation, digital-to-analog conversion, multiplexing, interleaving, mapping, or encoding, among other examples), and may transmit the processed signals to the apparatus 1008. In some aspects, the transmission component 1004 may include one or more antennas, a modem, a modulator, a transmit MIMO processor, a transmit processor, a controller/processor, a memory, or a combination thereof, of the UE described in connection with FIG. 2. In some aspects, the transmission component 1004 may be co-located with the reception component 1002 in a transceiver.

The communication manager 1006 may support operations of the reception component 1002 and/or the transmission component 1004. For example, the communication manager 1006 may receive information associated with configuring reception of communications by the reception component 1002 and/or transmission of communications by the transmission component 1004. Additionally, or alternatively, the communication manager 1006 may generate and/or provide control information to the reception component 1002 and/or the transmission component 1004 to control reception and/or transmission of communications.

In some aspects, the apparatus 1000 may be a transmitter device, such as the transmitter device 605 described in connection with FIG. 6.

The transmission component 1004 may transmit, to each receiver device of a plurality of receiver devices communicating with the transmitter device over a wideband channel using FDM, an indication of a bandwidth portion of the wideband channel to be used by the receiver device for performing measurements associated with a non-linear model of the transmitter device. The transmission component 1004 may transmit, to each receiver device of the plurality of receiver devices, one or more wideband reference signals associated with training the non-linear model. The reception component 1002 may receive a plurality of DPD coefficients, each DPD coefficient of the plurality of DPD coefficients being received from a receiver device of the plurality of receiver devices and being based at least in part on a channel estimation measurement or a channel equalization measurement associated with the one or more wideband reference signals and a respective bandwidth portion of the wideband channel. The reception component 1002 may obtain a set of DPD coefficients based at least in part on combining the plurality of DPD coefficients received from the plurality of receiver devices. The communication manager 1006 may perform DPD processing in accordance with the set of DPD coefficients.

The communication manager 1006 may select the plurality of receiver devices from a set of receiver devices based at least in part on one or more characteristics of the wideband channel or the non-linear model. The transmission component 1004 may transmit, to the plurality of receiver devices, configuration information indicating one or more parameters for performing measurements associated with the one or more wideband reference signals. The communication manager 1006 may update a plurality of DPD coefficients in accordance with receiving the plurality of DPD coefficients from the plurality of receiver devices. The transmission component 1004 may transmit, to each receiver device of a set of receiver devices associated with training the non-linear model, an indication of transmission information associated with transmitting the plurality of DPD coefficients, wherein the transmission information includes at least a first subset of transmission information to be used by a first receiver device of the plurality of receiver devices for performing measurements and a second subset of transmission information to be used by a second receiver device of the plurality of receiver devices for performing measurements. The communication manager 1006 may manage the plurality of DPD coefficients, wherein the plurality of DPD coefficients are associated with a transmitter beam index, and wherein the plurality of DPD coefficients are associated with a narrowband bandwidth portion for which the set of DPD coefficients are to be reported to the transmitter device. The communication manager 1006 may replace a first DPD coefficient with a second DPD coefficient, wherein the second DPD coefficient is received after the first DPD coefficient. The communication manager 1006 may mark the narrowband bandwidth portion with a time stamp. The communication manager 1006 may refrain from using the narrowband bandwidth portion in accordance with an expiration of the time stamp, wherein the averaging operation is performed in accordance with a quality of the first DPD coefficient and the second DPD coefficient.

In some aspects, the apparatus 1000 may be a receiver device, such as the receiver device 610 or the receiver device 615 described in connection with FIG. 6.

The reception component 1002 may receive, from a transmitter device, an indication of a bandwidth portion of a wideband channel to be used by the receiver device for performing measurements associated with a non-linear model of the transmitter device. The reception component 1002 may receive, from the transmitter device, one or more wideband reference signals associated with training the non-linear model. The reception component 1002 may obtain a DPD coefficient based at least in part on performing a channel estimation measurement or a channel equalization measurement associated with the one or more wideband reference signals and within the bandwidth portion. The transmission component 1004 may transmit, to the transmitter device, the DPD coefficient.

The reception component 1002 may receive, from the transmitter device, one or more parameters for performing measurements associated with the one or more wideband reference signals. The reception component 1002 may receive, from the transmitter device while the receiver device is training the non-linear model, an indication of transmission information associated with transmitting the DPD coefficients, wherein the transmission information is specific to the receiver device.

The number and arrangement of components shown in FIG. 10 are provided as an example. In practice, there may be additional components, fewer components, different components, or differently arranged components than those shown in FIG. 10. Furthermore, two or more components shown in FIG. 10 may be implemented within a single component, or a single component shown in FIG. 10 may be implemented as multiple, distributed components. Additionally, or alternatively, a set of (one or more) components shown in FIG. 10 may perform one or more functions described as being performed by another set of components shown in FIG. 10.

Figure 11:
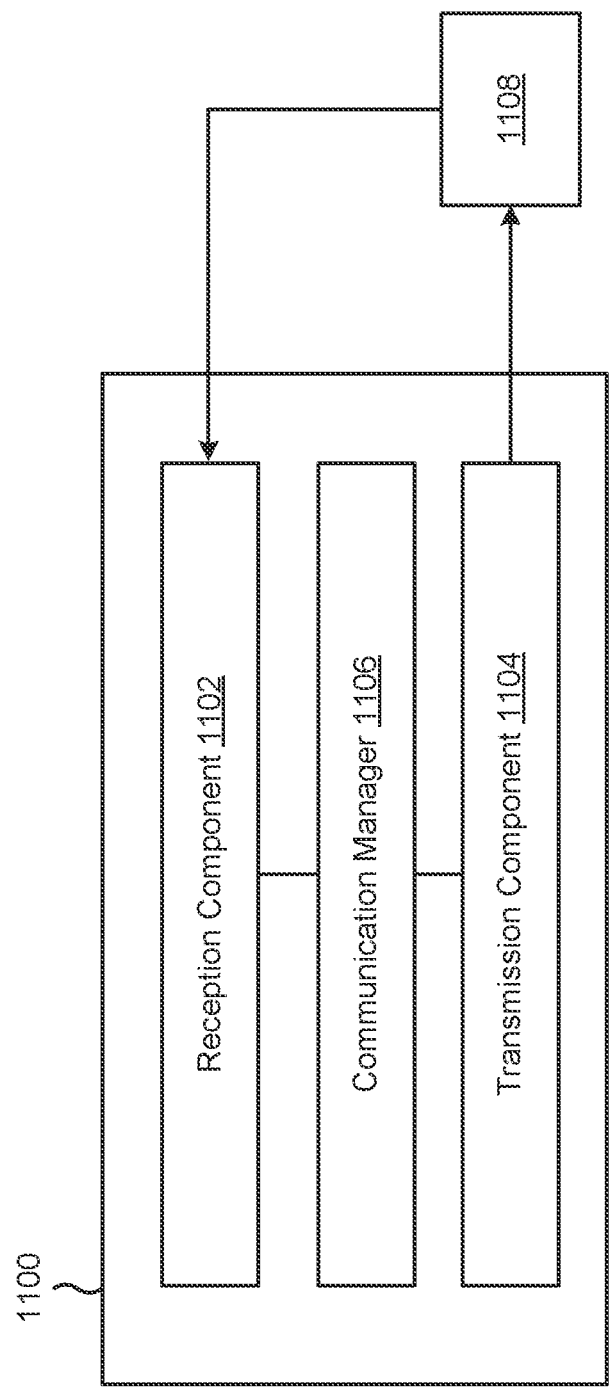
FIG. 11 is a diagram of an example apparatus for wireless communication, in accordance with the present disclosure.

FIG. 11 is a diagram of an example apparatus 1100 for wireless communication, in accordance with the present disclosure. The apparatus 1100 may be a network node, or a network node may include the apparatus 1100. In some aspects, the apparatus 1100 includes a reception component 1102, a transmission component 1104, and/or a communication manager 1106, which may be in communication with one another (for example, via one or more buses and/or one or more other components). In some aspects, the communication manager 1106 is the communication manager 150 described in connection with FIG. 1. As shown, the apparatus 1100 may communicate with another apparatus 1108, such as a UE or a network node (such as a CU, a DU, an RU, or a base station), using the reception component 1102 and the transmission component 1104.

In some aspects, the apparatus 1100 may be configured to perform one or more operations described herein in connection with FIGS. 6-7. Additionally, or alternatively, the apparatus 1100 may be configured to perform one or more processes described herein, such as process 800 of FIG. 8, process 900 of FIG. 9, or a combination thereof. In some aspects, the apparatus 1100 and/or one or more components shown in FIG. 11 may include one or more components of the network node described in connection with FIG. 2. Additionally, or alternatively, one or more components shown in FIG. 11 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1102 may receive communications, such as reference signals, control information, data communications, or a combination thereof, from the apparatus 1108. The reception component 1102 may provide received communications to one or more other components of the apparatus 1100. In some aspects, the reception component 1102 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 1100. In some aspects, the reception component 1102 may include one or more antennas, a modem, a demodulator, a MIMO detector, a receive processor, a controller/processor, a memory, or a combination thereof, of the network node described in connection with FIG. 2. In some aspects, the reception component 1102 and/or the transmission component 1104 may include or may be included in a network interface. The network interface may be configured to obtain and/or output signals for the apparatus 1100 via one or more communications links, such as a backhaul link, a midhaul link, and/or a fronthaul link.

The transmission component 1104 may transmit communications, such as reference signals, control information, data communications, or a combination thereof, to the apparatus 1108. In some aspects, one or more other components of the apparatus 1100 may generate communications and may provide the generated communications to the transmission component 1104 for transmission to the apparatus 1108. In some aspects, the transmission component 1104 may perform signal processing on the generated communications (such as filtering, amplification, modulation, digital-to-analog conversion, multiplexing, interleaving, mapping, or encoding, among other examples), and may transmit the processed signals to the apparatus 1108. In some aspects, the transmission component 1104 may include one or more antennas, a modem, a modulator, a transmit MIMO processor, a transmit processor, a controller/processor, a memory, or a combination thereof, of the network node described in connection with FIG. 2. In some aspects, the transmission component 1104 may be co-located with the reception component 1102 in a transceiver.

The communication manager 1106 may support operations of the reception component 1102 and/or the transmission component 1104. For example, the communication manager 1106 may receive information associated with configuring reception of communications by the reception component 1102 and/or transmission of communications by the transmission component 1104. Additionally, or alternatively, the communication manager 1106 may generate and/or provide control information to the reception component 1102 and/or the transmission component 1104 to control reception and/or transmission of communications.

In some aspects, the apparatus 1100 may be a transmitter device, such as the transmitter device 605 described in connection with FIG. 6.

The transmission component 1104 may transmit, to each receiver device of a plurality of receiver devices communicating with the transmitter device over a wideband channel using FDM, an indication of a bandwidth portion of the wideband channel to be used by the receiver device for performing measurements associated with a non-linear model of the transmitter device. The transmission component 1104 may transmit, to each receiver device of the plurality of receiver devices, one or more wideband reference signals associated with training the non-linear model. The reception component 1102 may receive a plurality of DPD coefficients, each DPD coefficient of the plurality of DPD coefficients being received from a receiver device of the plurality of receiver devices and being based at least in part on a channel estimation measurement or a channel equalization measurement associated with the one or more wideband reference signals and a respective bandwidth portion of the wideband channel. The reception component 1102 may obtain a set of DPD coefficients based at least in part on combining the plurality of DPD coefficients received from the plurality of receiver devices. The communication manager 1106 may perform DPD processing in accordance with the set of DPD coefficients.

The communication manager 1106 may select the plurality of receiver devices from a set of receiver devices based at least in part on one or more characteristics of the wideband channel or the non-linear model. The transmission component 1104 may transmit, to the plurality of receiver devices, configuration information indicating one or more parameters for performing measurements associated with the one or more wideband reference signals. The communication manager 1106 may update a plurality of DPD coefficients in accordance with receiving the plurality of DPD coefficients from the plurality of receiver devices. The transmission component 1104 may transmit, to each receiver device of a set of receiver devices associated with training the non-linear model, an indication of transmission information associated with transmitting the plurality of DPD coefficients, wherein the transmission information includes at least a first subset of transmission information to be used by a first receiver device of the plurality of receiver devices for performing measurements and a second subset of transmission information to be used by a second receiver device of the plurality of receiver devices for performing measurements. The communication manager 1106 may manage the plurality of DPD coefficients, wherein the plurality of DPD coefficients are associated with a transmitter beam index, and wherein the plurality of DPD coefficients are associated with a narrowband bandwidth portion for which the set of DPD coefficients are to be reported to the transmitter device. The communication manager 1106 may replace a first DPD coefficient with a second DPD coefficient, wherein the second DPD coefficient is received after the first DPD coefficient. The communication manager 1106 may mark the narrowband bandwidth portion with a time stamp. The communication manager 1106 may refrain from using the narrowband bandwidth portion in accordance with an expiration of the time stamp, wherein the averaging operation is performed in accordance with a quality of the first DPD coefficient and the second DPD coefficient.

In some aspects, the apparatus 1100 may be a receiver device, such as the receiver device 610 or the receiver device 615 described in connection with FIG. 6.

The reception component 1102 may receive, from a transmitter device, an indication of a bandwidth portion of a wideband channel to be used by the receiver device for performing measurements associated with a non-linear model of the transmitter device. The reception component 1102 may receive, from the transmitter device, one or more wideband reference signals associated with training the non-linear model. The reception component 1102 may obtain a DPD coefficient based at least in part on performing a channel estimation measurement or a channel equalization measurement associated with the one or more wideband reference signals and within the bandwidth portion. The transmission component 1104 may transmit, to the transmitter device, the DPD coefficient.

The reception component 1102 may receive, from the transmitter device, one or more parameters for performing measurements associated with the one or more wideband reference signals. The reception component 1102 may receive, from the transmitter device while the receiver device is training the non-linear model, an indication of transmission information associated with transmitting the DPD coefficients, wherein the transmission information is specific to the receiver device.

The number and arrangement of components shown in FIG. 11 are provided as an example. In practice, there may be additional components, fewer components, different components, or differently arranged components than those shown in FIG. 11. Furthermore, two or more components shown in FIG. 11 may be implemented within a single component, or a single component shown in FIG. 11 may be implemented as multiple, distributed components. Additionally, or alternatively, a set of (one or more) components shown in FIG. 11 may perform one or more functions described as being performed by another set of components shown in FIG. 11.

The following provides an overview of some Aspects of the present disclosure:

Aspect 1: A method of wireless communication performed by a transmitter device, comprising: transmitting, to each receiver device of a plurality of receiver devices communicating with the transmitter device over a wideband channel using frequency division multiplexing (FDM), an indication of a bandwidth portion of the wideband channel to be used by the receiver device for performing measurements associated with a non-linear model of the transmitter device; transmitting, to each receiver device of the plurality of receiver devices, one or more wideband reference signals associated with training the non-linear model; receiving a plurality of digital pre-distortion (DPD) coefficients, each DPD coefficient of the plurality of DPD coefficients being received from a receiver device of the plurality of receiver devices and being based at least in part on a channel estimation measurement or a channel equalization measurement associated with the one or more wideband reference signals and a respective bandwidth portion of the wideband channel; obtaining a set of DPD coefficients based at least in part on combining the plurality of DPD coefficients received from the plurality of receiver devices; and performing DPD processing in accordance with the set of DPD coefficients.

Aspect 2: The method of Aspect 1, further comprising: selecting the plurality of receiver devices from a set of receiver devices based at least in part on one or more characteristics of the wideband channel or the non-linear model; and transmitting, to the plurality of receiver devices, configuration information indicating one or more parameters for performing measurements associated with the one or more wideband reference signals.

Aspect 3: The method of Aspect 2, wherein a total bandwidth portion allocated to the plurality of receiver devices for performing the measurements associated with the non-linear model is less than a total bandwidth portion of the wideband channel.

Aspect 4: The method of Aspect 3, further comprising updating a plurality of DPD coefficients in accordance with receiving the plurality of DPD coefficients from the plurality of receiver devices.

Aspect 5: The method of Aspect 2, wherein the one or more parameters for performing the measurements include at least one of a type of non-linear model training associated with the non-linear model, a kernel list that indicates one or more kernels for which the plurality of DPD coefficients are required, a wideband reference signal parameter that indicates the one or more wideband reference signals to be used for training the non-linear model, a receiver-device-specific parameter that indicates a resource block to be used by a receiver device of the plurality of receiver devices, or an indication of a root mean square associated with a first linear kernel.

Aspect 6: The method of any of Aspects 1-5, further comprising transmitting, to each receiver device of a set of receiver devices associated with training the non-linear model, an indication of transmission information associated with transmitting the plurality of DPD coefficients, wherein the transmission information includes at least a first subset of transmission information to be used by a first receiver device of the plurality of receiver devices for performing measurements and a second subset of transmission information to be used by a second receiver device of the plurality of receiver devices for performing measurements.

Aspect 7: The method of Aspect 6, wherein transmitting the indication of the transmission information comprises transmitting, to each receiver device of the set of receiver devices, the indication of the transmission information by the set of receiver devices while the set of receiver devices are training the non-linear model.

Aspect 8: The method of Aspect 6, wherein the indication of the transmission information includes at least one of an indication of one or more resource blocks on which the one or more wideband reference signals are to be allocated, an indication of a digital precoding associated with the one or more wideband reference signals, or information associated with the one or more wideband reference signals.

Aspect 9: The method of any of Aspects 1-8, wherein receiving the plurality of DPD coefficients comprises receiving an estimation of each DPD coefficient of the plurality of DPD coefficients and an indication of a quality of the estimation of each DPD coefficient of the plurality of DPD coefficients.

Aspect 10: The method of Aspect 9, wherein the transmitter device is a network node and the plurality of receiver devices are a plurality of user equipments, and wherein receiving the plurality of DPD coefficients comprises directly receiving a DPD coefficient from each user equipment of the plurality of user equipments.

Aspect 11: The method of Aspect 9, wherein the transmitter device is a first user equipment and the plurality of receiver devices includes at least a second user equipment and a third user equipment, and wherein receiving the plurality of DPD coefficients comprises receiving, via a network node, a first DPD coefficient associated with the second user equipment and a second DPD coefficient associated with the third user equipment.

Aspect 12: The method of Aspect 9, wherein the transmitter device is a first user equipment and the plurality of receiver devices includes at least a second user equipment and a third user equipment, and wherein receiving the plurality of DPD coefficients comprises directly receiving a first DPD coefficient from the second user equipment and a second DPD coefficient from the third user equipment.

Aspect 13: The method of any of Aspects 1-12, further comprising managing the plurality of DPD coefficients, wherein the plurality of DPD coefficients are associated with a transmitter beam index, and wherein the plurality of DPD coefficients are associated with a narrowband bandwidth portion for which the set of DPD coefficients are to be reported to the transmitter device.

Aspect 14: The method of Aspect 13, further comprising replacing a first DPD coefficient with a second DPD coefficient, wherein the second DPD coefficient is received after the first DPD coefficient.

Aspect 15: The method of Aspect 14, wherein replacing the first DPD coefficient with the second DPD coefficient comprises replacing the first DPD coefficient with the second DPD coefficient in accordance with an infinite impulse response filter or an averaging operation.

Aspect 16: The method of Aspect 15, further comprising: marking the narrowband bandwidth portion with a time stamp; and refraining from using the narrowband bandwidth portion in accordance with an expiration of the time stamp, wherein the averaging operation is performed in accordance with a quality of the first DPD coefficient and the second DPD coefficient.

Aspect 17: The method of any of Aspects 1-16, wherein obtaining the set of DPD coefficients based at least in part on combining the plurality of DPD coefficients comprises obtaining a wideband set of DPD coefficients based at least in part on averaging the plurality of DPD coefficients received from the plurality of receiver devices, and wherein performing the DPD processing in accordance with the set of DPD coefficients comprises performing the DPD processing in accordance with the wideband set of DPD coefficients.

Aspect 18: The method of any of Aspects 1-17, wherein performing the DPD processing comprises performing the DPD processing on a signal to be transmitted to one or more receiver devices of the plurality of receiver devices.

Aspect 19: A method of wireless communication performed by a receiver device, comprising: receiving, from a transmitter device, an indication of a bandwidth portion of a wideband channel to be used by the receiver device for performing measurements associated with a non-linear model of the transmitter device; receiving, from the transmitter device, one or more wideband reference signals associated with training the non-linear model; obtaining a digital pre-distortion (DPD) coefficient based at least in part on performing a channel estimation measurement or a channel equalization measurement associated with the one or more wideband reference signals and within the bandwidth portion; and transmitting, to the transmitter device, the DPD coefficient.

Aspect 20: The method of Aspect 19, further comprising receiving, from the transmitter device, one or more parameters for performing measurements associated with the one or more wideband reference signals.

Aspect 21: The method of Aspect 20, wherein the one or more parameters for performing the measurements include at least one of a type of non-linear model training associated with the non-linear model, a kernel list that indicates one or more kernels for which the DPD coefficient is required, a wideband reference signal parameter that indicates the one or more wideband reference signals to be used for training the non-linear model, a receiver-device-specific parameter that indicates a resource block to be used by the receiver device, or an indication of a root mean square associated with a first linear kernel.

Aspect 22: The method of any of Aspects 19-21, further comprising receiving, from the transmitter device while the receiver device is training the non-linear model, an indication of transmission information associated with transmitting the DPD coefficients, wherein the transmission information is specific to the receiver device.

Aspect 23: The method of Aspect 22, wherein the indication of the transmission information includes at least one of an indication of one or more resource blocks on which is the one or more wideband reference signals are to be allocated, an indication of a digital precoding associated with the one or more wideband reference signals, or information associated with the one or more wideband reference signals.

Aspect 24: The method of any of Aspects 19-23, wherein obtaining the DPD coefficient comprises: performing the channel estimation measurement and the channel equalization measurement associated with the one or more wideband reference signals; estimating the DPD coefficient in accordance with a kernel list that indicates one or more kernels for which the DPD coefficient is required; and determining a quality of the estimation of the DPD coefficient.

Aspect 25: The method of any of Aspects 19-24, wherein transmitting the DPD coefficient comprises transmitting an estimation of the DPD coefficient and an indication of a quality of the estimation of the DPD coefficient.

Aspect 26: The method of Aspect 25, wherein the transmitter device is a network node and the receiver device is a user equipment, and wherein transmitting the DPD coefficient comprises transmitting the DPD coefficient directly to the network node.

Aspect 27: The method of Aspect 25, wherein the transmitter device is a first user equipment and the receiver device is a second user equipment, and wherein transmitting the DPD coefficient comprises transmitting the DPD coefficient to a network node for relaying to the first user equipment.

Aspect 28: The method of Aspect 25, wherein the transmitter device is a first user equipment and the receiver device is a second user equipment, and wherein transmitting the DPD coefficient comprises transmitting the DPD coefficient directly to the first user equipment.

Aspect 29: An apparatus for wireless communication at a device, comprising a processor; memory coupled with the processor; and instructions stored in the memory and executable by the processor to cause the apparatus to perform the method of one or more of Aspects 1-28.

Aspect 30: A device for wireless communication, comprising a memory and one or more processors coupled to the memory, the one or more processors configured to perform the method of one or more of Aspects 1-28.

Aspect 31: An apparatus for wireless communication, comprising at least one means for performing the method of one or more of Aspects 1-28.

Aspect 32: A non-transitory computer-readable medium storing code for wireless communication, the code comprising instructions executable by a processor to perform the method of one or more of Aspects 1-28.

Aspect 33: A non-transitory computer-readable medium storing a set of instructions for wireless communication, the set of instructions comprising one or more instructions that, when executed by one or more processors of a device, cause the device to perform the method of one or more of Aspects 1-28.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or any conventional processor, controller, microcontroller, or state machine. A processor also may be implemented as a combination of computing devices, for example, a combination of a DSP and a microprocessor, a plurality of microprocessors, one or more microprocessors in conjunction with a DSP core, or any other such configuration. In some aspects, particular processes and methods may be performed by circuitry that is specific to a given function.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "of" is intended to be inclusive when used in a series and may be used interchangeably with "and/or," unless explicitly stated otherwise (e.g., if used in combination with "either" or "only one of").

What is claimed is:

1. A transmitter device for wireless communication, comprising:
one or more memories; and
one or more processors, coupled to the one or more memories, configured to:
transmit, to each receiver device of a plurality of receiver devices communicating with the transmitter device over a wideband channel using frequency division multiplexing (FDM), an indication of a bandwidth portion of the wideband channel to be used by the receiver device for performing measurements associated with a non-linear model of the transmitter device;
transmit, to each receiver device of the plurality of receiver devices, one or more wideband reference signals associated with training the non-linear model;
receive a plurality of digital pre-distortion (DPD) coefficients, each DPD coefficient of the plurality of DPD coefficients being received from a receiver device of the plurality of receiver devices and being based at least in part on a channel estimation measurement or a channel equalization measurement associated with the one or more wideband reference signals and a respective bandwidth portion of the wideband channel;
obtain a set of DPD coefficients based at least in part on combining the plurality of DPD coefficients received from the plurality of receiver devices; and
perform DPD processing in accordance with the set of DPD coefficients.

2. The transmitter device of claim 1, wherein the one or more processors are further configured to:
select the plurality of receiver devices from a set of receiver devices based at least in part on one or more characteristics of the wideband channel or the non-linear model; and
transmit, to the plurality of receiver devices, configuration information indicating one or more parameters for performing measurements associated with the one or more wideband reference signals.

3. The transmitter device of claim 2, wherein a total bandwidth portion allocated to the plurality of receiver devices for performing the measurements associated with the non-linear model is less than a total bandwidth portion of the wideband channel.

4. The transmitter device of claim 3, wherein the one or more processors are further configured to update a plurality of DPD coefficients in accordance with receiving the plurality of DPD coefficients from the plurality of receiver devices.

5. The transmitter device of claim 2, wherein the one or more parameters for performing the measurements include at least one of a type of non-linear model training associated with the non-linear model, a kernel list that indicates one or more kernels for which the plurality of DPD coefficients are required, a wideband reference signal parameter that indicates the one or more wideband reference signals to be used for training the non-linear model, a receiver-device-specific parameter that indicates a resource block to be used by a receiver device of the plurality of receiver devices, or an indication of a root mean square associated with a first linear kernel.

6. The transmitter device of claim 1, wherein the one or more processors are further configured to transmit, to each receiver device of a set of receiver devices associated with training the non-linear model, an indication of transmission information associated with transmitting the plurality of DPD coefficients, wherein the transmission information includes at least a first subset of transmission information to be used by a first receiver device of the plurality of receiver devices for performing measurements and a second subset of transmission information to be used by a second receiver device of the plurality of receiver devices for performing measurements.

7. The transmitter device of claim 6, wherein the one or more processors, to transmit the indication of the transmission information, are configured to transmit, to each receiver device of the set of receiver devices, the indication of the transmission information by the set of receiver devices while the set of receiver devices are training the non-linear model.

8. The transmitter device of claim 6, wherein the indication of the transmission information includes at least one of an indication of one or more resource blocks on which the one or more wideband reference signals are to be allocated, an indication of a digital precoding associated with the one or more wideband reference signals, or information associated with the one or more wideband reference signals.

9. The transmitter device of claim 1, wherein the one or more processors, to receive the plurality of DPD coefficients, are configured to receive an estimation of each DPD coefficient of the plurality of DPD coefficients and an indication of a quality of the estimation of each DPD coefficient of the plurality of DPD coefficients.

10. The transmitter device of claim 9, wherein the transmitter device is a network node and the plurality of receiver devices are a plurality of user equipments, and wherein receiving the plurality of DPD coefficients comprises directly receiving a DPD coefficient from each user equipment of the plurality of user equipments.

11. The transmitter device of claim 9, wherein the transmitter device is a first user equipment and the plurality of receiver devices includes at least a second user equipment and a third user equipment, and wherein receiving the plurality of DPD coefficients comprises receiving, via a network node, a first DPD coefficient associated with the second user equipment and a second DPD coefficient associated with the third user equipment.

12. The transmitter device of claim 9, wherein the transmitter device is a first user equipment and the plurality of receiver devices includes at least a second user equipment and a third user equipment, and wherein receiving the plurality of DPD coefficients comprises directly receiving a first DPD coefficient from the second user equipment and a second DPD coefficient from the third user equipment.

13. The transmitter device of claim 1, wherein the one or more processors are further configured to manage the plurality of DPD coefficients, wherein the plurality of DPD coefficients are associated with a transmitter beam index, and wherein the plurality of DPD coefficients are associated with a narrowband bandwidth portion for which the set of DPD coefficients are to be reported to the transmitter device.

14. The transmitter device of claim 13, wherein the one or more processors are further configured to replace a first DPD coefficient with a second DPD coefficient, wherein the second DPD coefficient is received after the first DPD coefficient.

15. The transmitter device of claim 14, wherein the one or more processors, to replace the first DPD coefficient with the second DPD coefficient, are configured to replace the first DPD coefficient with the second DPD coefficient in accordance with an infinite impulse response filter or an averaging operation.

16. The transmitter device of claim 15, wherein the one or more processors are further configured to:
mark the narrowband bandwidth portion with a time stamp; and
refrain from using the narrowband bandwidth portion in accordance with an expiration of the time stamp, wherein the averaging operation is performed in accordance with a quality of the first DPD coefficient and the second DPD coefficient.

17. The transmitter device of claim 1, wherein obtaining the set of DPD coefficients comprises obtaining a wideband set of DPD coefficients based at least in part on averaging the plurality of DPD coefficients received from the plurality of receiver devices, and wherein performing the DPD processing in accordance with the set of DPD coefficients comprises performing the DPD processing in accordance with the wideband set of DPD coefficients.

18. The transmitter device of claim 1, wherein the one or more processors, to perform the DPD processing, are configured to perform the DPD processing on a signal to be transmitted to one or more receiver devices of the plurality of receiver devices.

19. A receiver device for wireless communication, comprising:
one or more memories; and
one or more processors, coupled to the one or more memories, configured to:
receive, from a transmitter device, an indication of a bandwidth portion of a wideband channel to be used by the receiver device for performing measurements associated with a non-linear model of the transmitter device;
receive, from the transmitter device, one or more wideband reference signals associated with training the non-linear model;
obtain a digital pre-distortion (DPD) coefficient based at least in part on performing a channel estimation measurement or a channel equalization measurement associated with the one or more wideband reference signals and within the bandwidth portion; and
transmit, to the transmitter device, the DPD coefficient.

20. The receiver device of claim 19, wherein the one or more processors are further configured to receive, from the transmitter device, one or more parameters for performing measurements associated with the one or more wideband reference signals.

21. The receiver device of claim 20, wherein the one or more parameters for performing the measurements include at least one of a type of non-linear model training associated with the non-linear model, a kernel list that indicates one or more kernels for which the DPD coefficient is required, a wideband reference signal parameter that indicates the one or more wideband reference signals to be used for training the non-linear model, a receiver-device-specific parameter that indicates a resource block to be used by the receiver device, or an indication of a root mean square associated with a first linear kernel.

22. The receiver device of claim 19, wherein the one or more processors are further configured to receive, from the transmitter device while the receiver device is training the non-linear model, an indication of transmission information associated with transmitting the DPD coefficients, wherein the transmission information is specific to the receiver device.

23. The receiver device of claim 22, wherein the indication of the transmission information includes at least one of an indication of one or more resource blocks on which is the one or more wideband reference signals are to be allocated, an indication of a digital precoding associated with the one or more wideband reference signals, or information associated with the one or more wideband reference signals.

24. The receiver device of claim 19, wherein the one or more processors, to obtain the DPD coefficient, are configured to:
perform the channel estimation measurement and the channel equalization measurement associated with the one or more wideband reference signals;
estimate the DPD coefficient in accordance with a kernel list that indicates one or more kernels for which the DPD coefficient is required; and
determine a quality of the estimation of the DPD coefficient.

25. The receiver device of claim 19, wherein the one or more processors, to transmit the DPD coefficient, are configured to transmit an estimation of the DPD coefficient and an indication of a quality of the estimation of the DPD coefficient.

26. The receiver device of claim 25, wherein the transmitter device is a network node and the receiver device is a user equipment, and wherein transmitting the DPD coefficient comprises transmitting the DPD coefficient directly to the network node.

27. The receiver device of claim 25, wherein the transmitter device is a first user equipment and the receiver device is a second user equipment, and wherein transmitting the DPD coefficient comprises transmitting the DPD coefficient to a network node for relaying to the first user equipment.

28. The receiver device of claim 25, wherein the transmitter device is a first user equipment and the receiver device is a second user equipment, and wherein transmitting the DPD coefficient comprises transmitting the DPD coefficient directly to the first user equipment.

29. A method of wireless communication performed by a transmitter device, comprising:
- transmitting, to each receiver device of a plurality of receiver devices communicating with the transmitter device over a wideband channel using frequency division multiplexing (FDM), an indication of a bandwidth portion of the wideband channel to be used by the receiver device for performing measurements associated with a non-linear model of the transmitter device;
- transmitting, to each receiver device of the plurality of receiver devices, one or more wideband reference signals associated with training the non-linear model;
- receiving a plurality of digital pre-distortion (DPD) coefficients, each DPD coefficient of the plurality of DPD coefficients being received from a receiver device of the plurality of receiver devices and being based at least in part on a channel estimation measurement or a channel equalization measurement associated with the one or more wideband reference signals and a respective bandwidth portion of the wideband channel;
- obtaining a set of DPD coefficients based at least in part on combining the plurality of DPD coefficients received from the plurality of receiver devices; and
- performing DPD processing in accordance with the set of DPD coefficients.

30. A method of wireless communication performed by a receiver device, comprising:
- receiving, from a transmitter device, an indication of a bandwidth portion of a wideband channel to be used by the receiver device for performing measurements associated with a non-linear model of the transmitter device;
- receiving, from the transmitter device, one or more wideband reference signals associated with training the non-linear model;
- obtaining a digital pre-distortion (DPD) coefficient based at least in part on performing a channel estimation measurement or a channel equalization measurement associated with the one or more wideband reference signals and within the bandwidth portion; and
- transmitting, to the transmitter device, the DPD coefficient.

* * * * *